(12) United States Patent
Ogasawara

(10) Patent No.: US 12,425,023 B2
(45) Date of Patent: Sep. 23, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Yosuke Ogasawara, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 26 days.

(21) Appl. No.: 18/600,151

(22) Filed: Mar. 8, 2024

(65) Prior Publication Data

US 2025/0055454 A1 Feb. 13, 2025

(30) Foreign Application Priority Data

Aug. 10, 2023 (JP) .................................. 2023-131410

(51) Int. Cl.
*H03K 17/693* (2006.01)
*H03K 19/003* (2006.01)

(52) U.S. Cl.
CPC ..... *H03K 17/693* (2013.01); *H03K 19/00323* (2013.01)

(58) Field of Classification Search
CPC .................................................. H03K 17/693
USPC ......................................................... 327/408
See application file for complete search history.

(56) References Cited

U.S. PATENT DOCUMENTS

| 10,044,349 B2 | 8/2018 | Scott et al. |
| 11,405,031 B1 | 8/2022 | Shrivastava et al. |
| 11,405,034 B1 | 8/2022 | Shapiro et al. |
| 11,405,035 B1 | 8/2022 | Genc et al. |
| 2011/0050323 A1 | 3/2011 | Seshita |
| 2012/0126875 A1 | 5/2012 | Teraguchi |
| 2013/0342259 A1 | 12/2013 | Teraguchi |
| 2023/0097937 A1* | 3/2023 | Kurachi ........... H03K 17/04106 327/333 |

FOREIGN PATENT DOCUMENTS

| JP | 2005-515657 A | 5/2005 |
| JP | 2011-055099 A | 3/2011 |
| JP | 2012-114608 A | 6/2012 |
| JP | 2014-003541 A | 1/2014 |
| JP | 2017-162532 A | 9/2017 |
| JP | 2023-046584 A | 4/2023 |
| WO | 03/032431 A2 | 4/2003 |

* cited by examiner

*Primary Examiner* — Tomi Skibinski
(74) *Attorney, Agent, or Firm* — Kim & Stewart LLP

(57) ABSTRACT

According to one embodiment, a semiconductor device includes a first transistor, a second transistor, a third transistor, a fourth transistor, a first level shifter, and a second level shifter. At a time of outputting a first voltage from a first terminal, a power supply voltage is supplied to the first terminal from the third transistor in accordance with a fourth signal output from the second level shifter, and then the first voltage is supplied to the first terminal from the first transistor in accordance with a second signal output from the first level shifter. At a time of outputting a second voltage from the first terminal, a ground voltage is supplied to the first terminal from the fourth transistor in accordance with the second signal, and then the second voltage is supplied to the first terminal from the second transistor in accordance with the fourth signal.

18 Claims, 19 Drawing Sheets

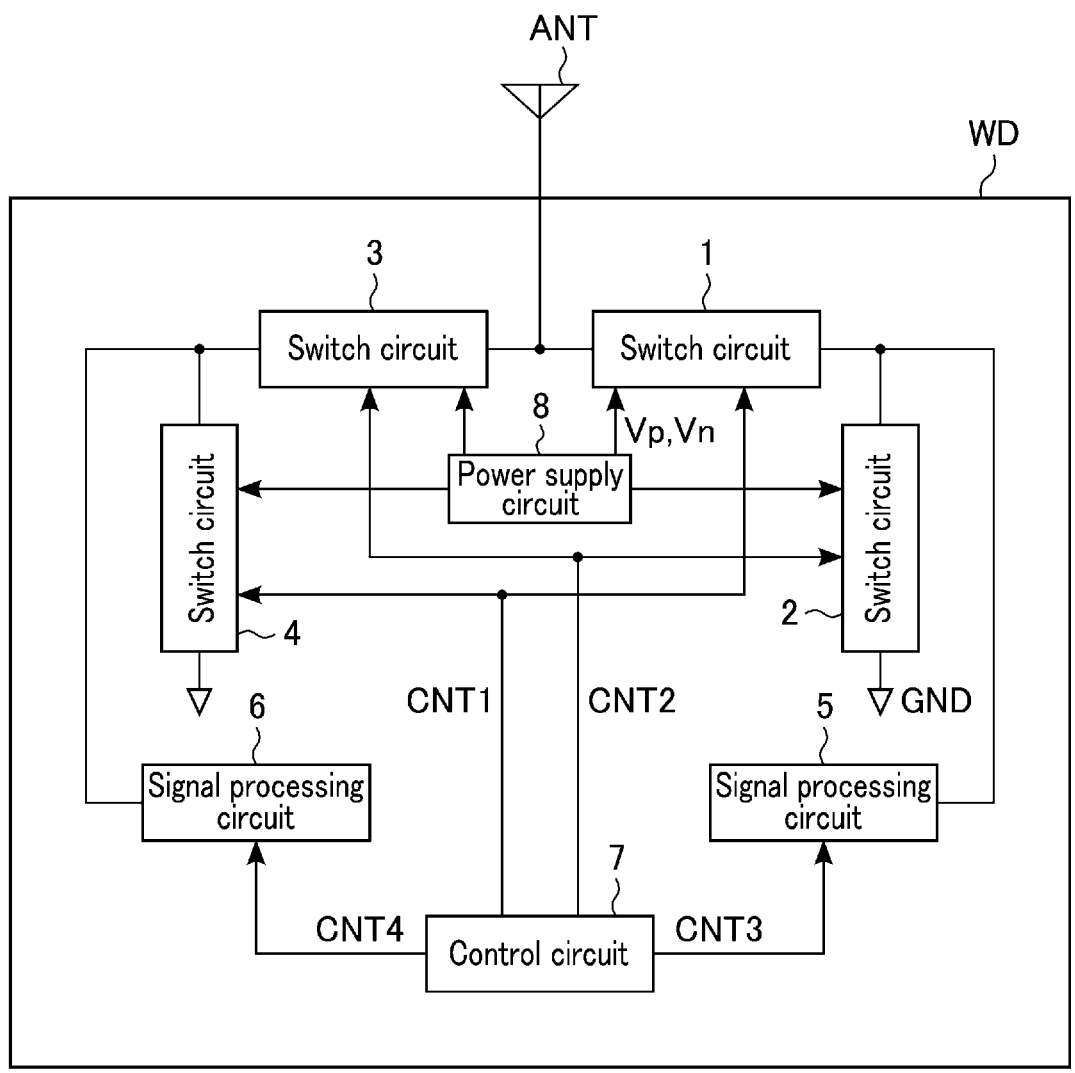
F I G. 1

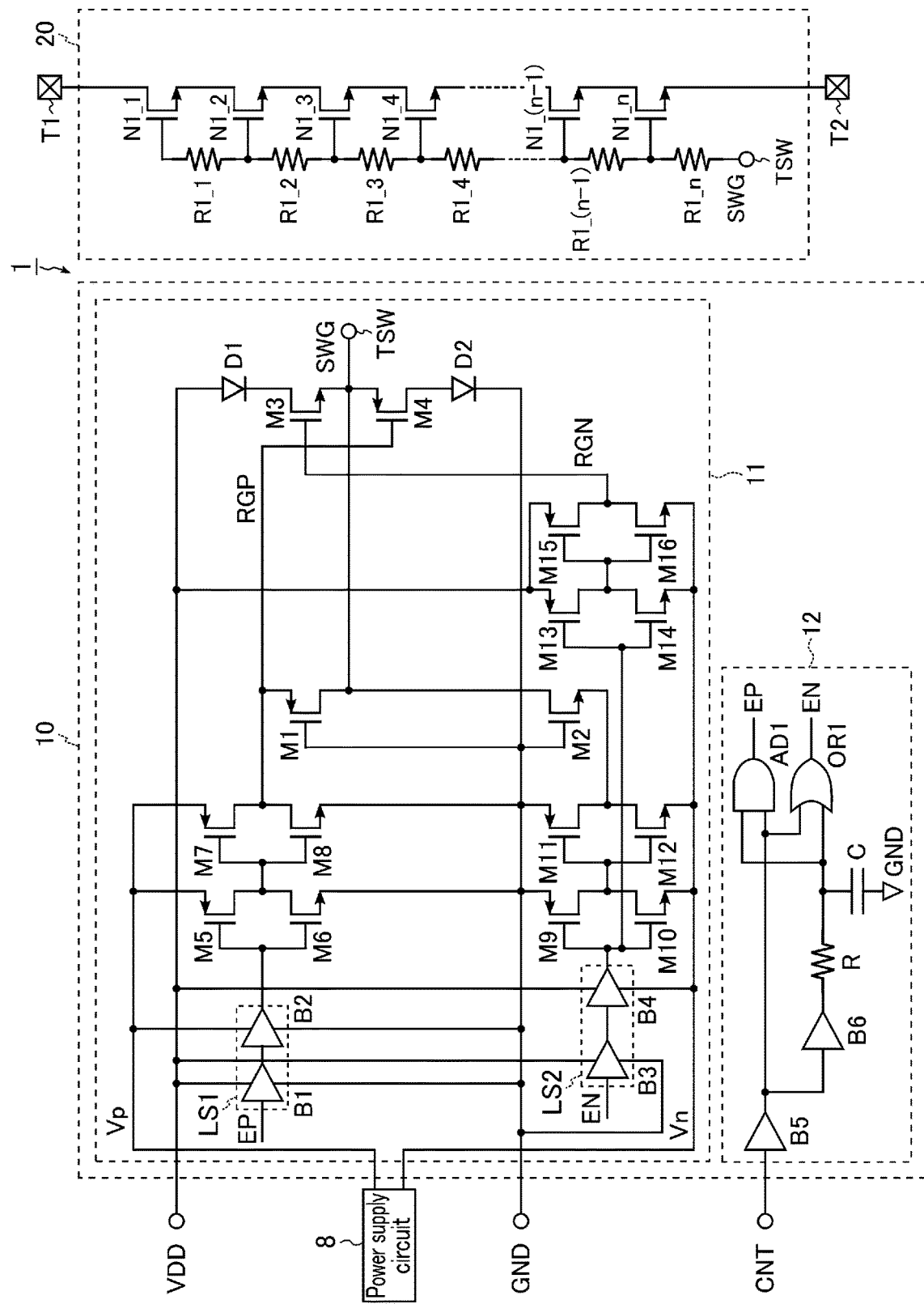
F I G. 2

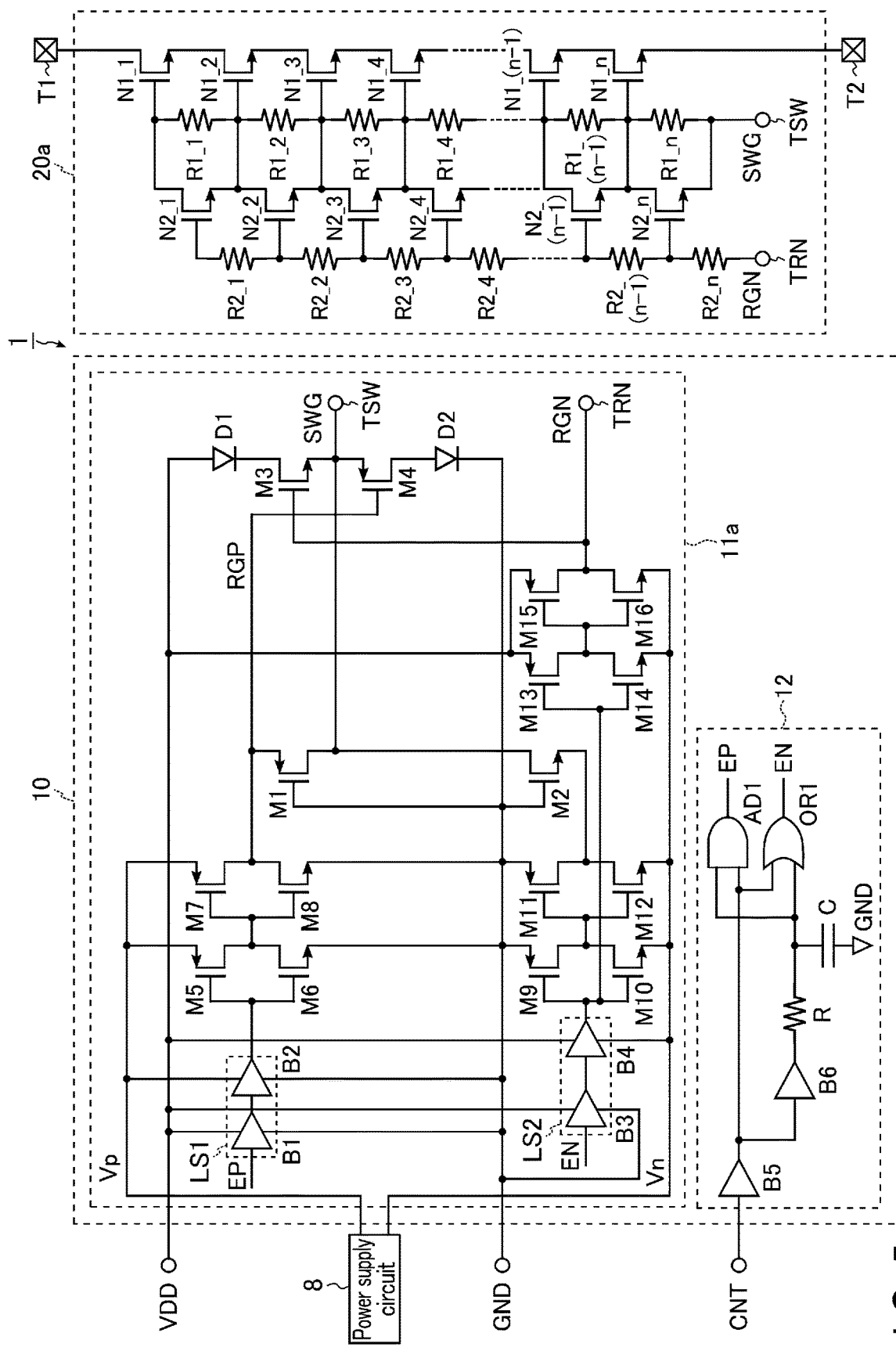
F I G. 5

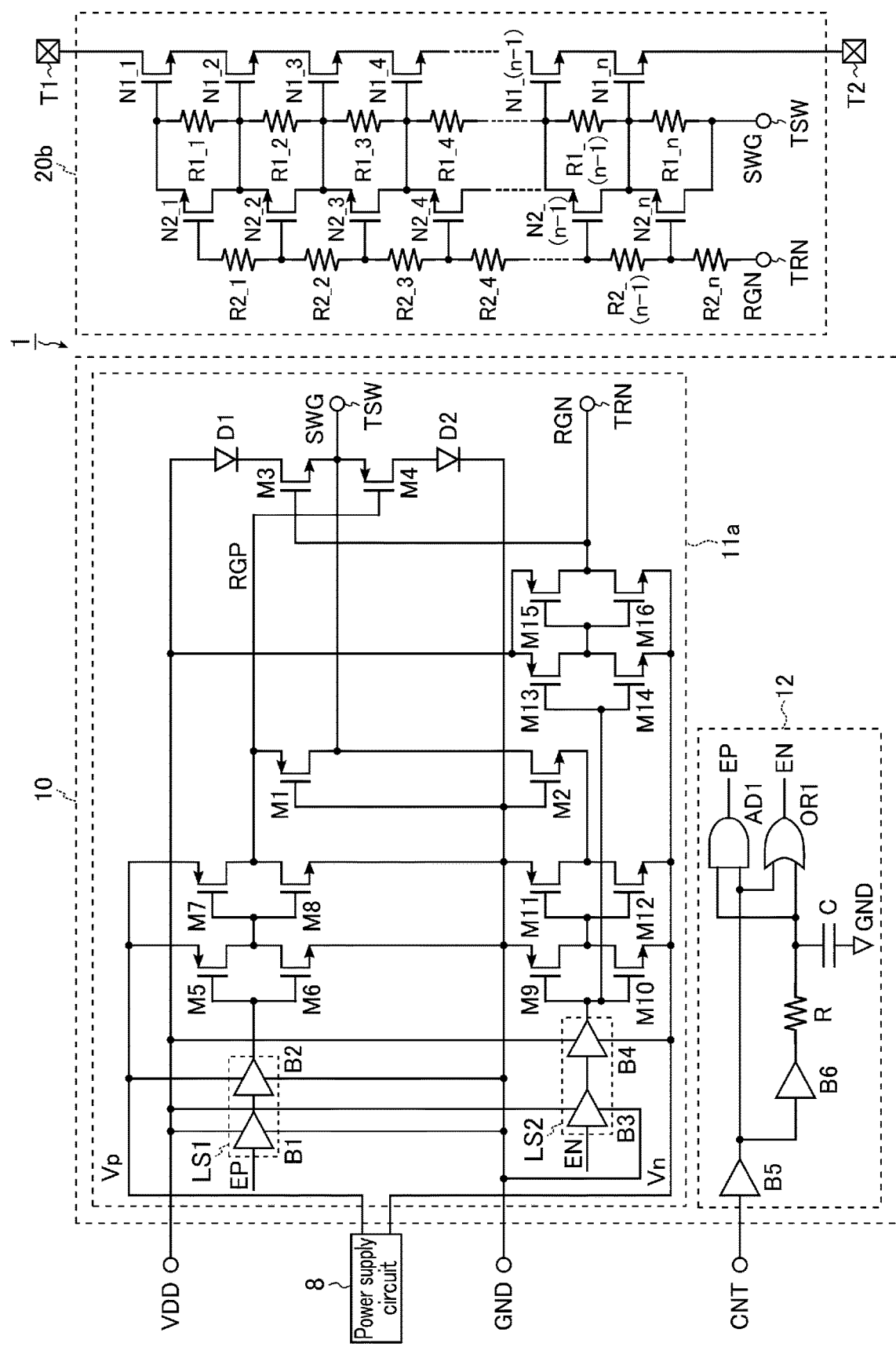
F I G. 6

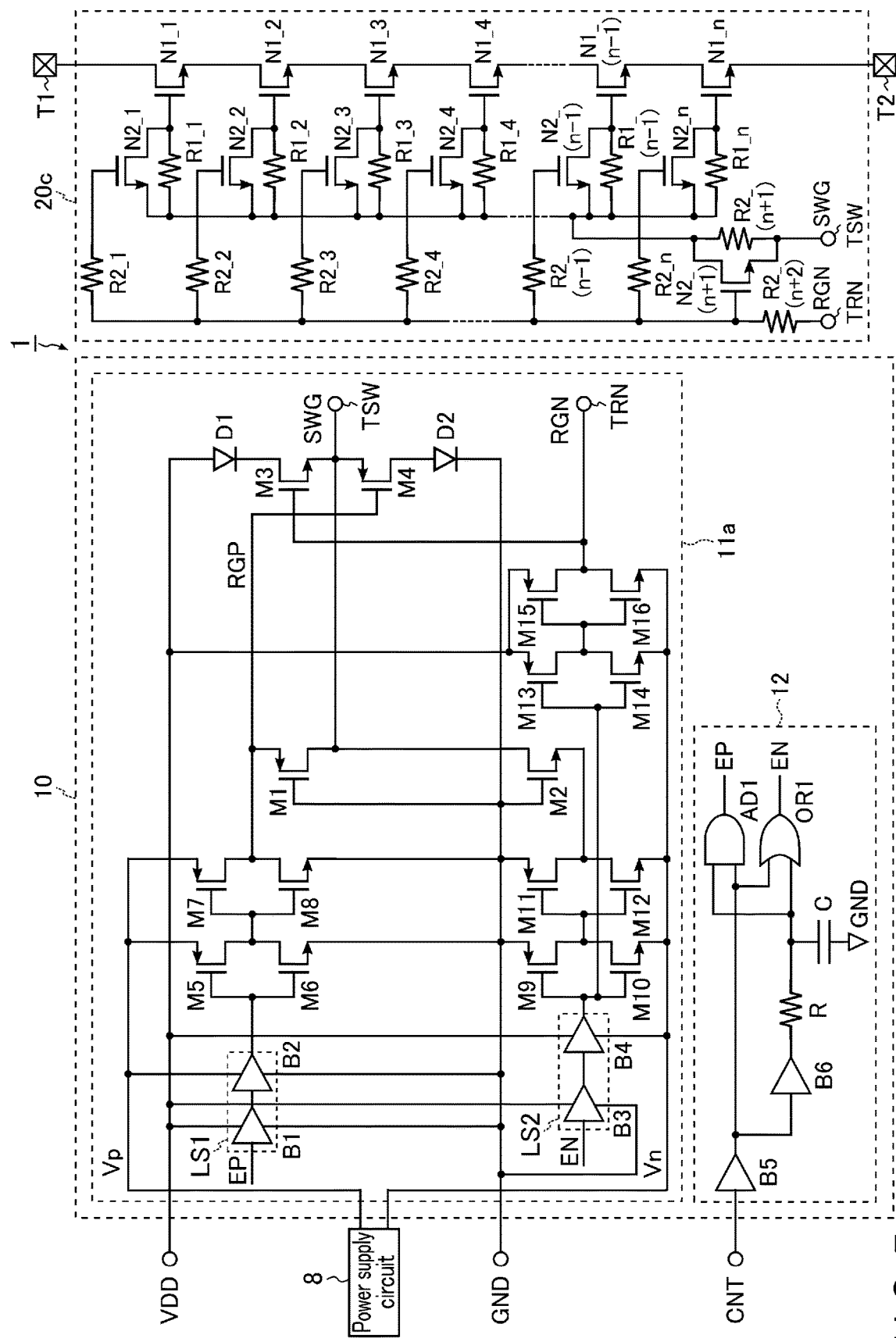
F I G. 7

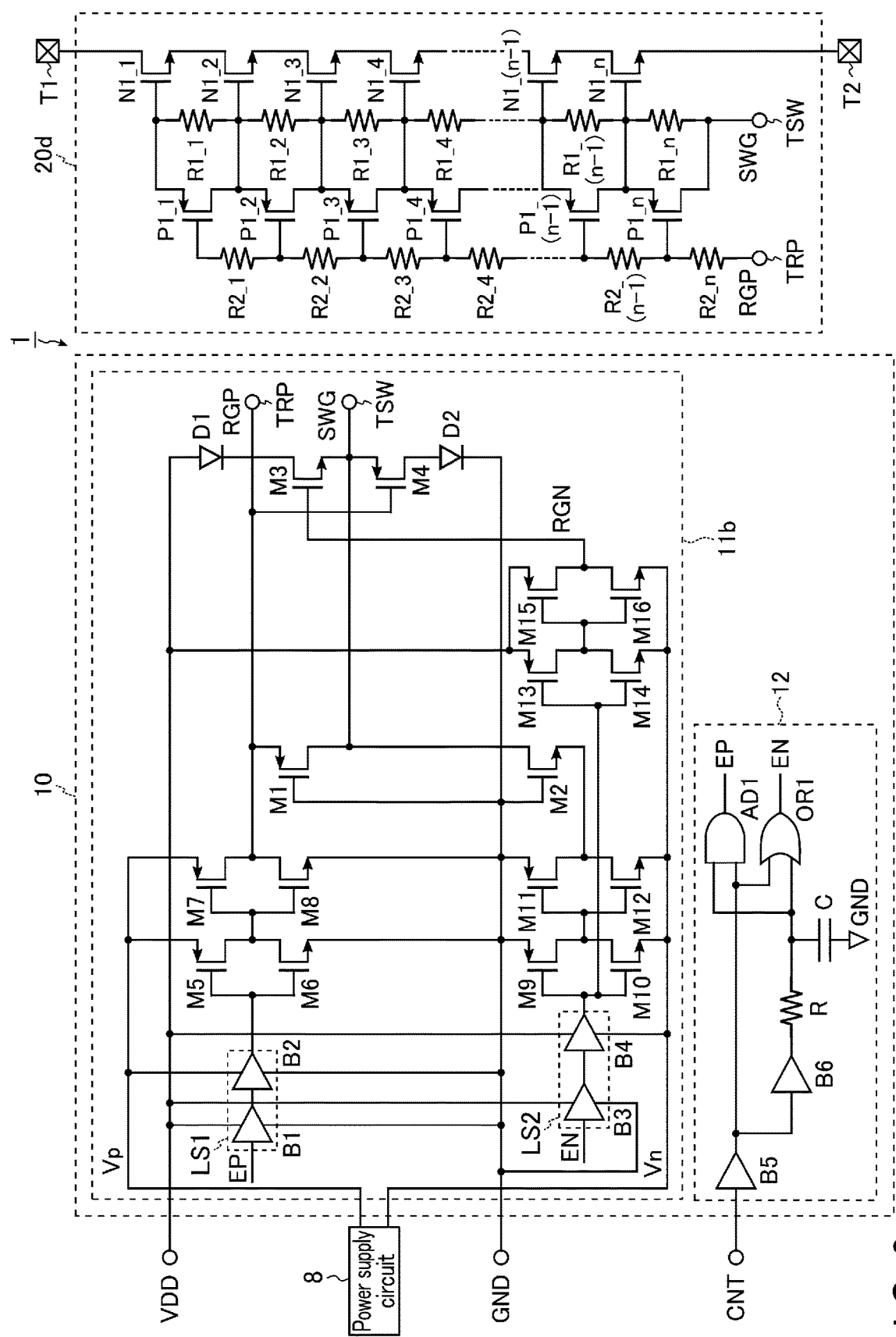
F I G. 8

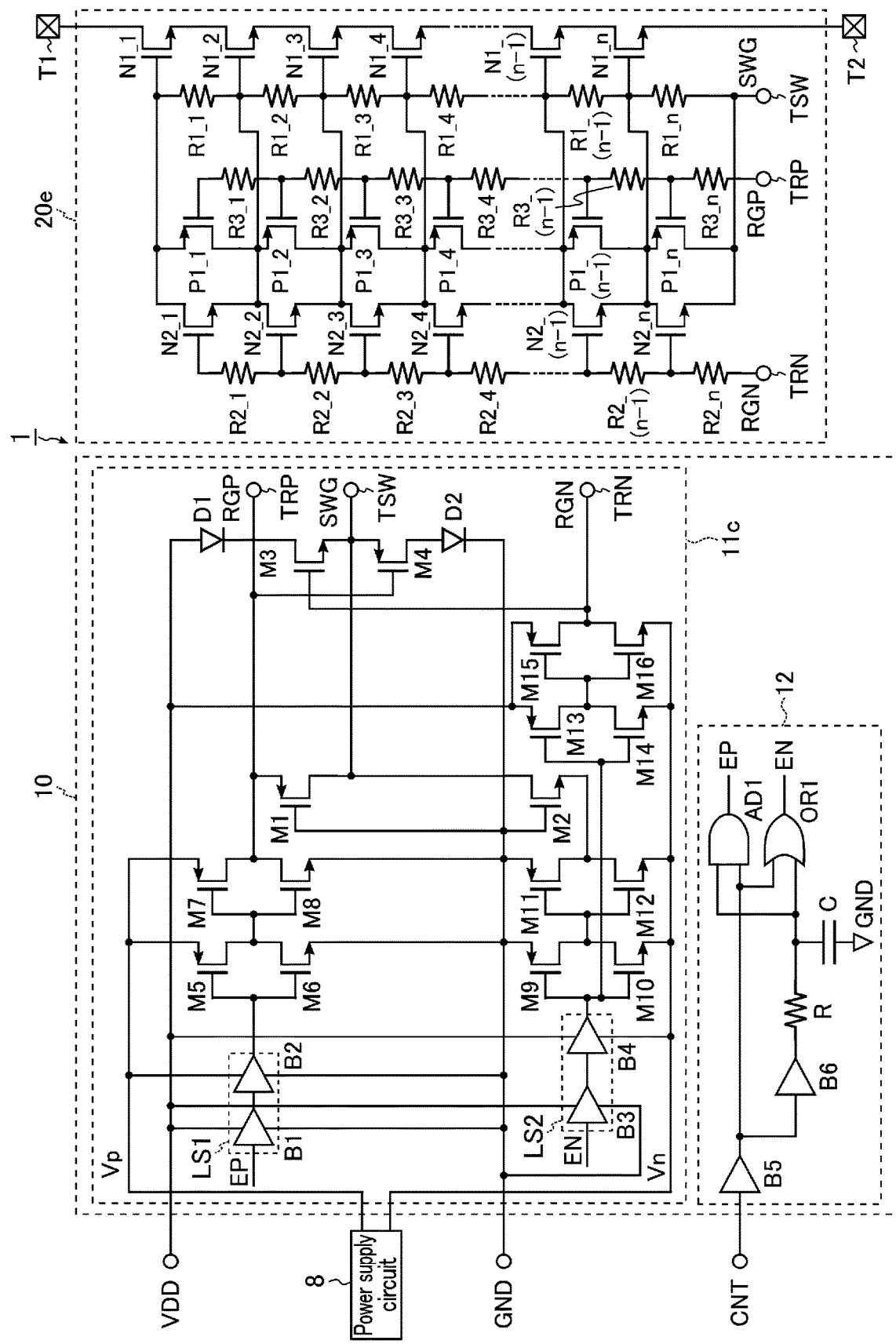
F I G. 9

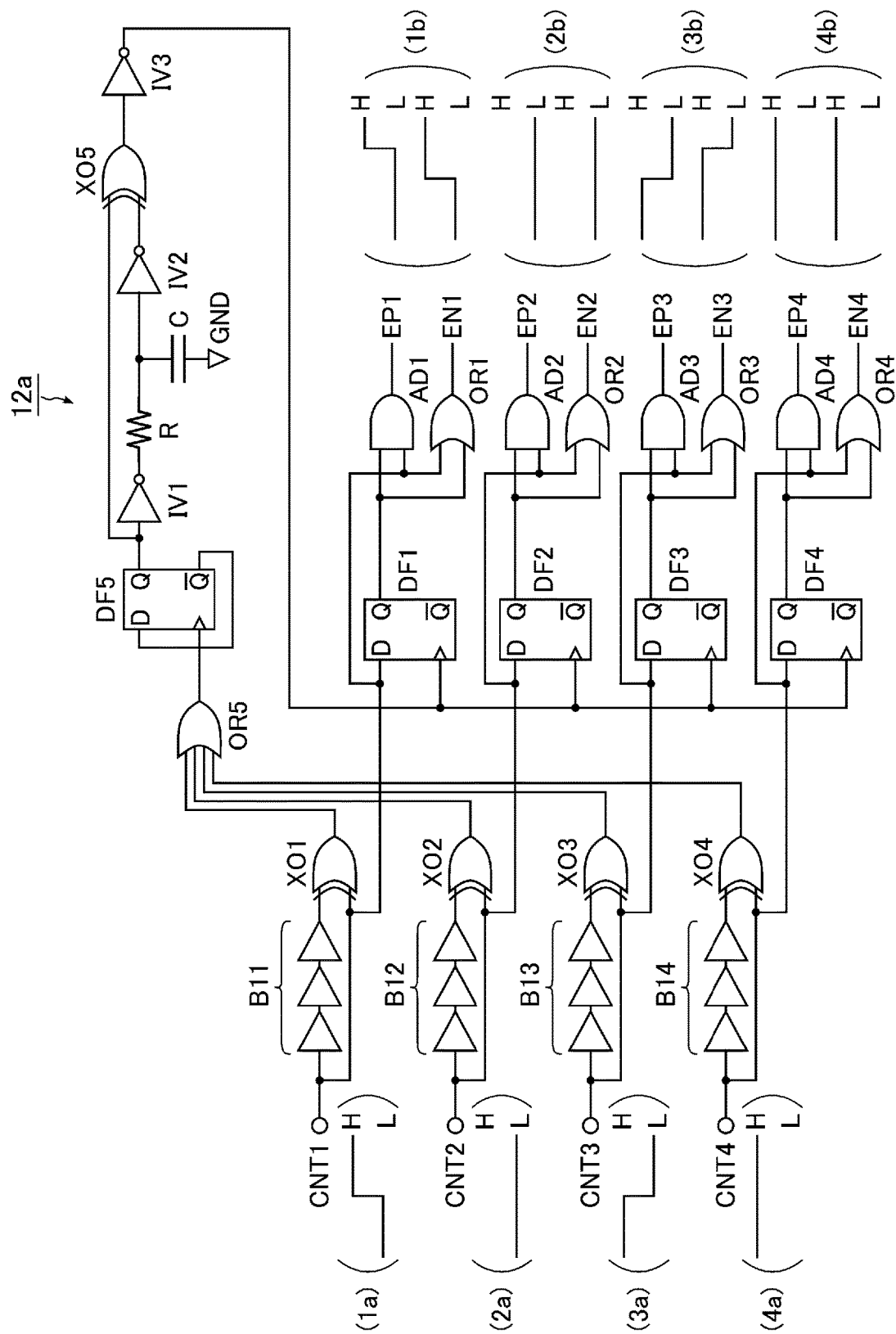
F I G. 10

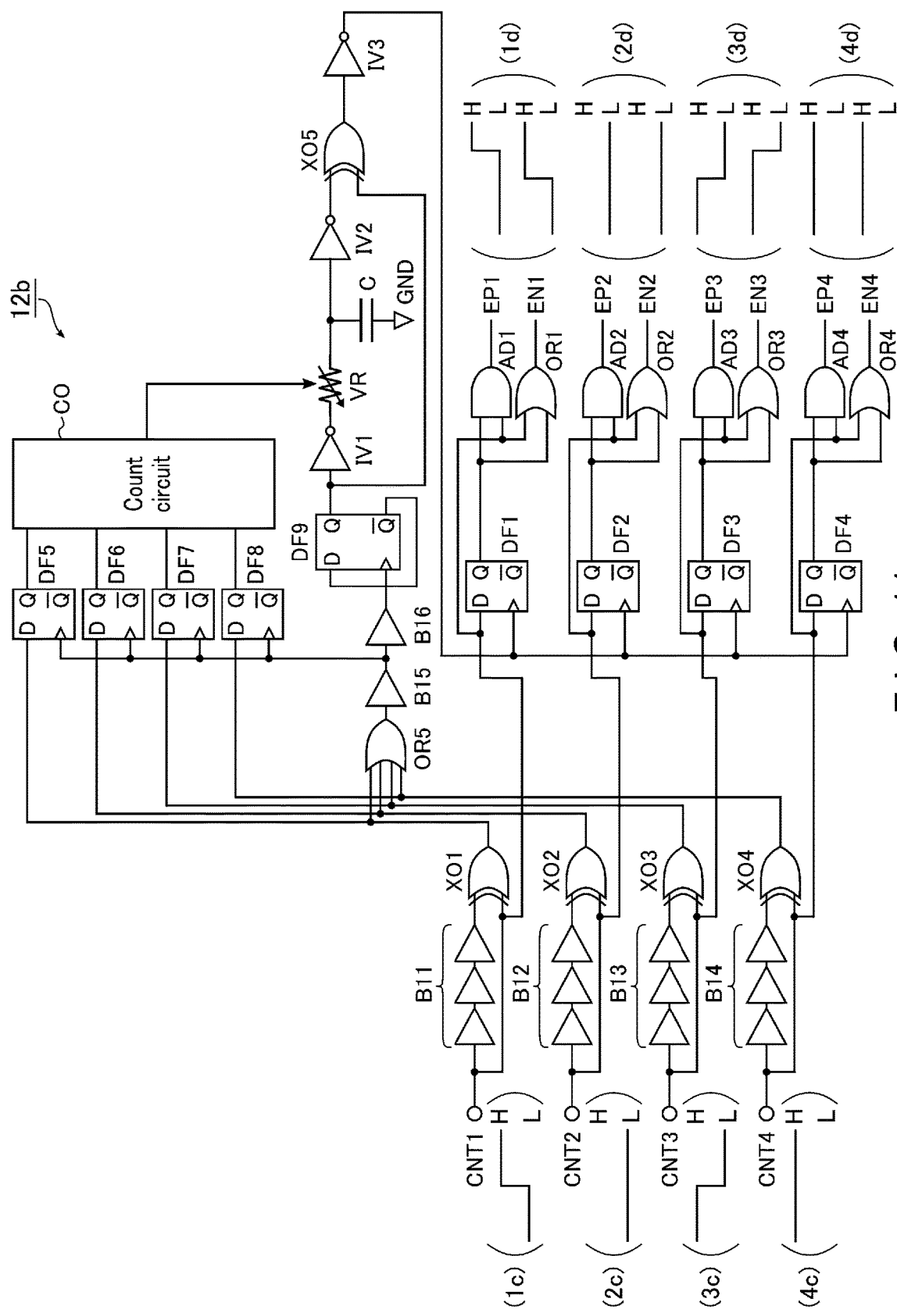
F I G. 11

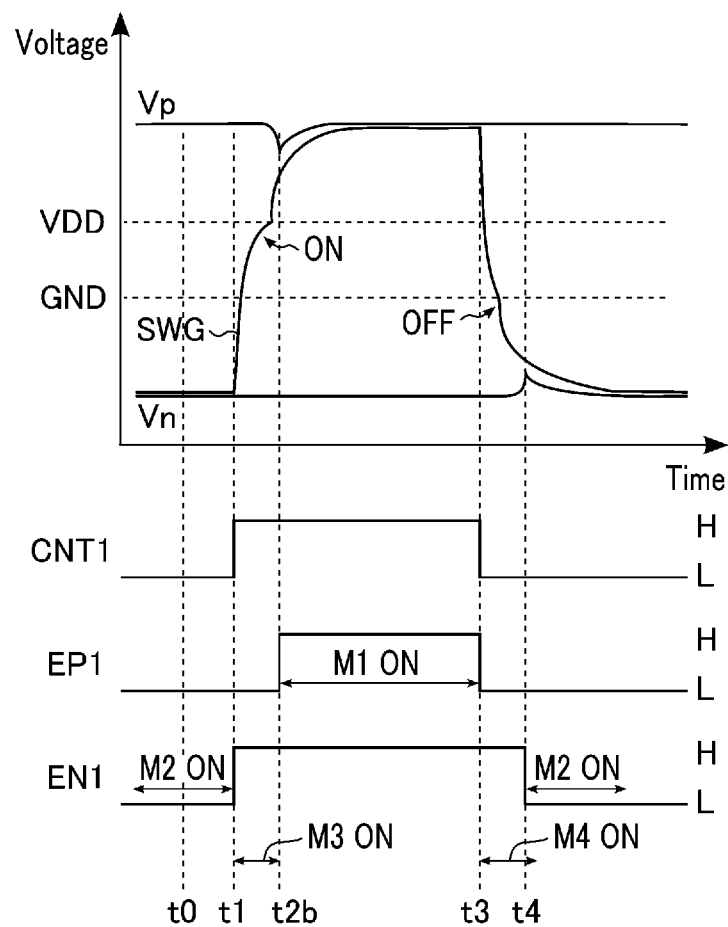
F I G. 12

(a) ON → OFF transition time
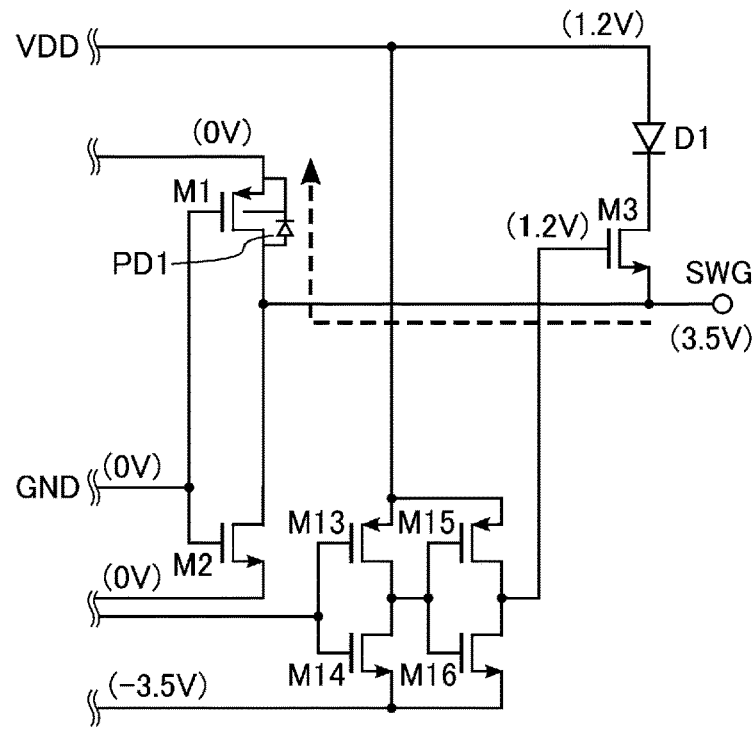
(b) ON → OFF transition time
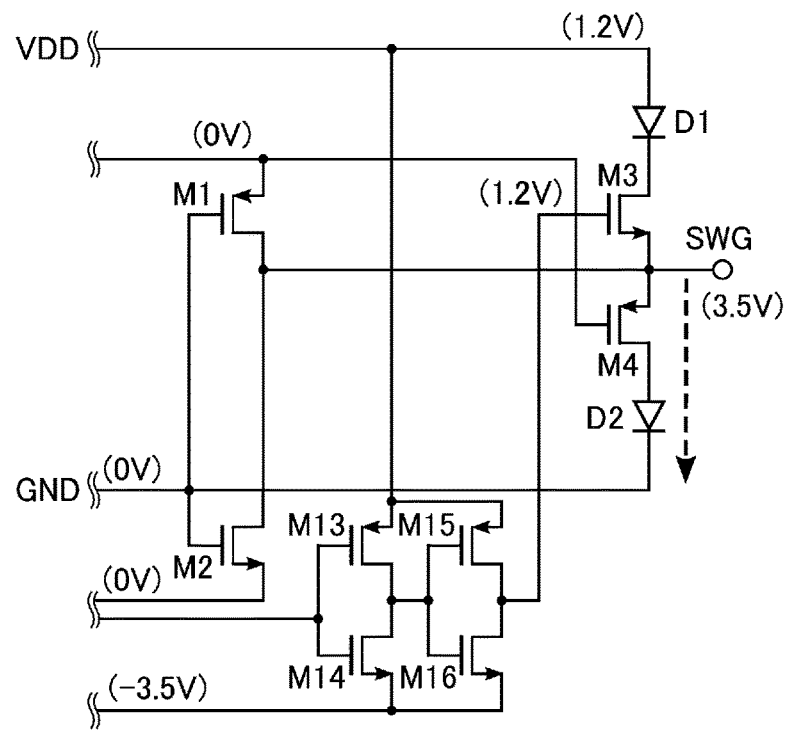
F I G. 16

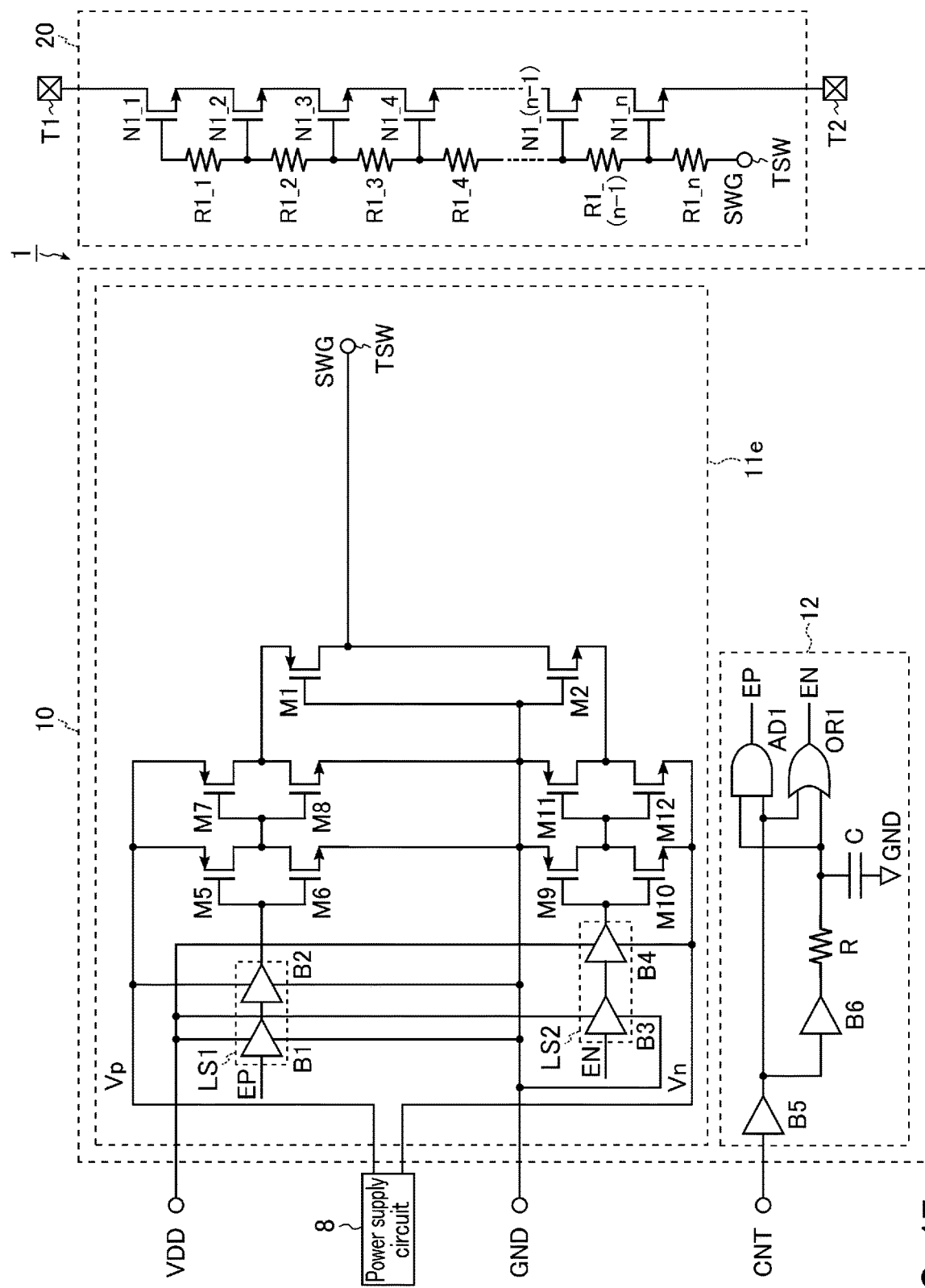
F I G. 17

(a) OFF → ON transition time
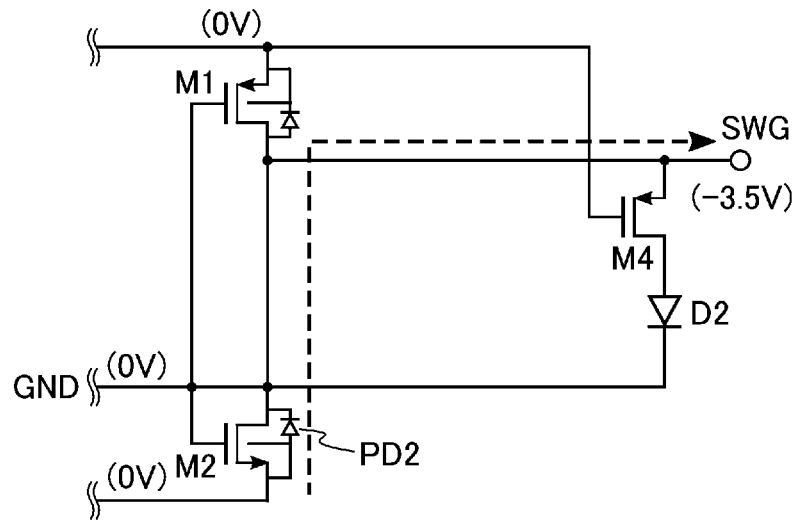
(b) OFF → ON transition time
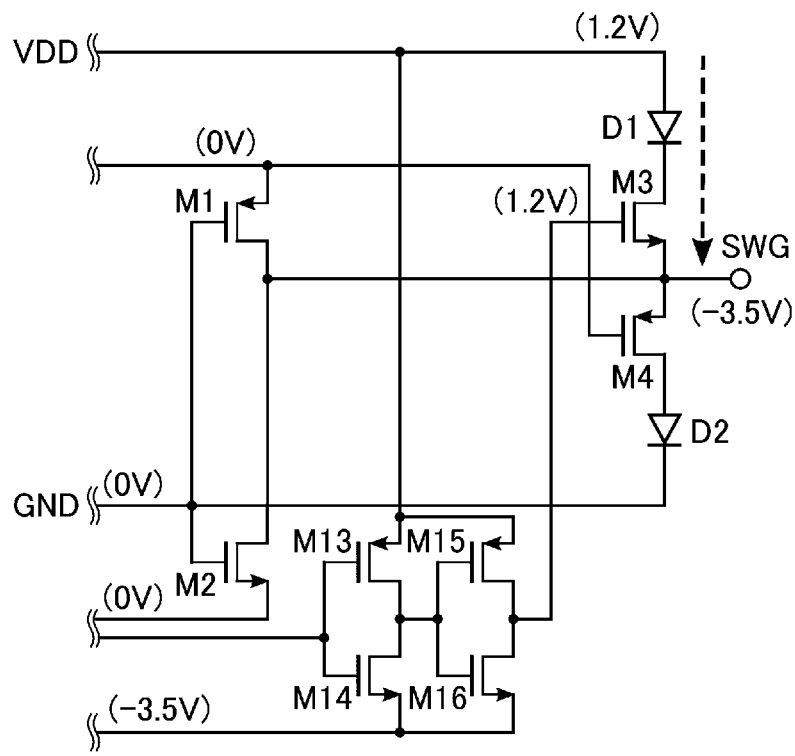
F I G. 18

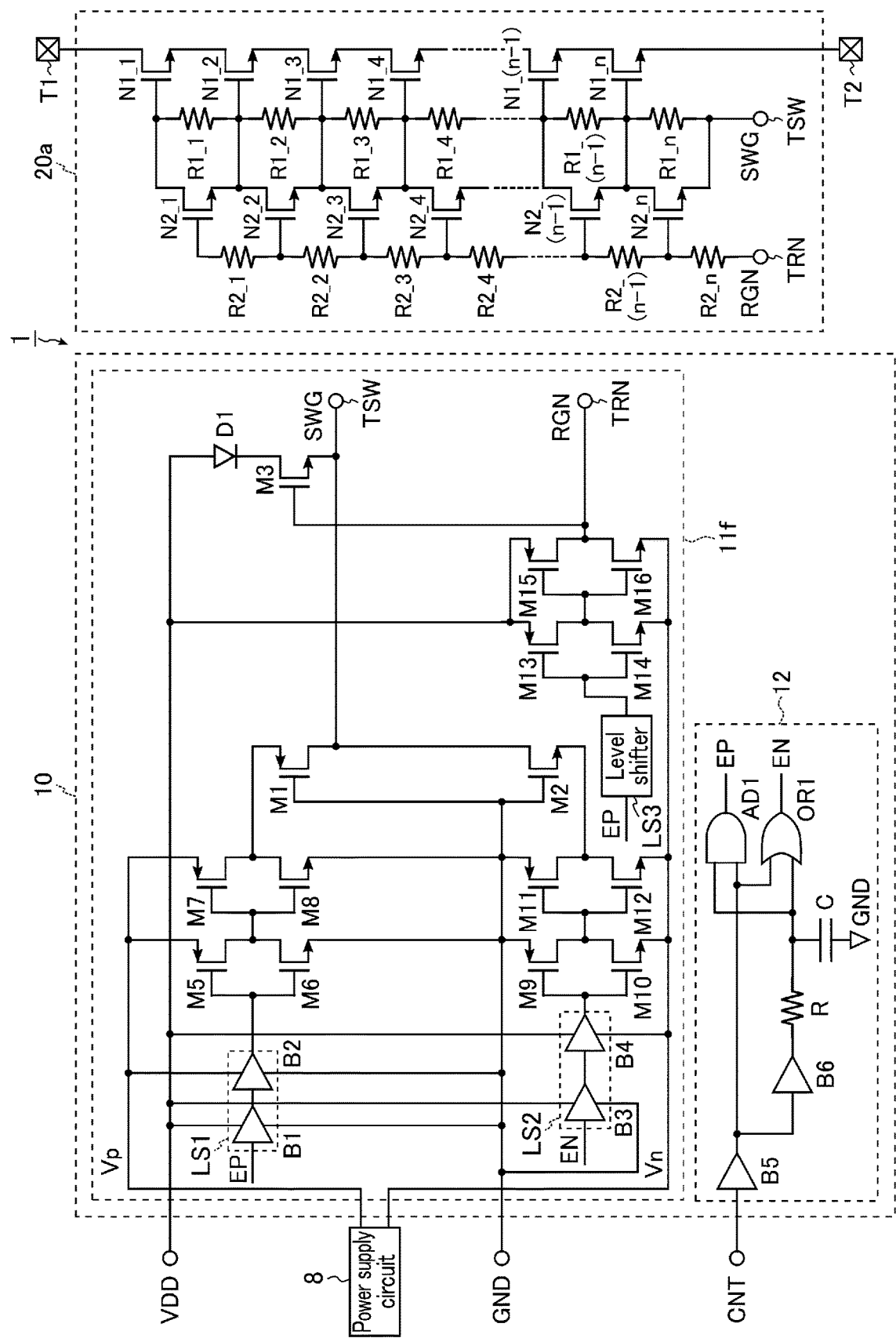
F I G. 19

(a) ON → OFF transition time (control at timing of signal EP)
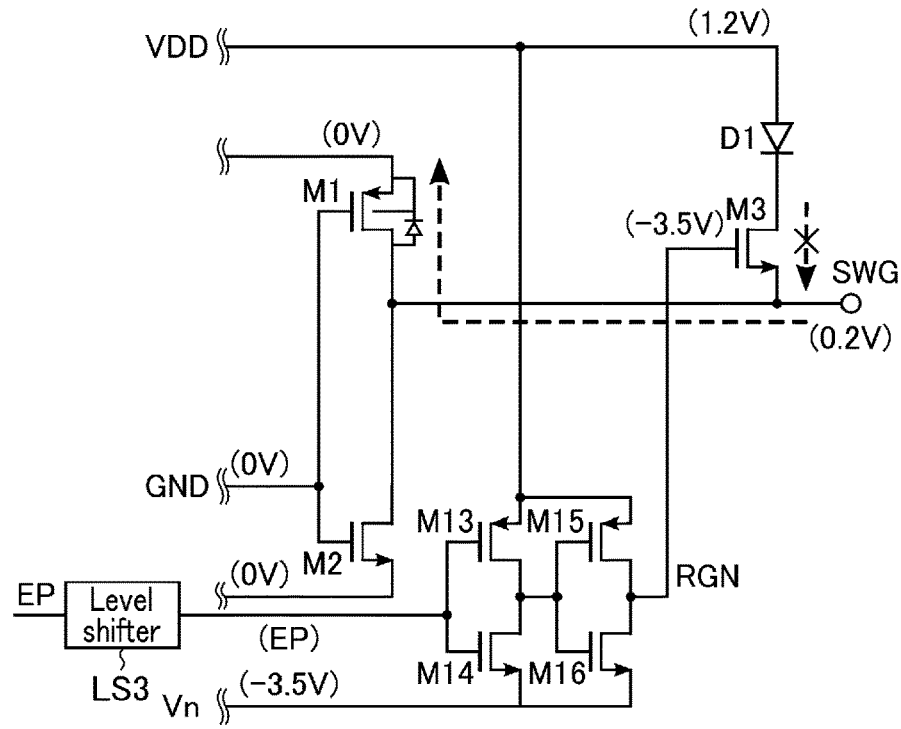
(b) ON → OFF transition time (control at timing of signal EN)
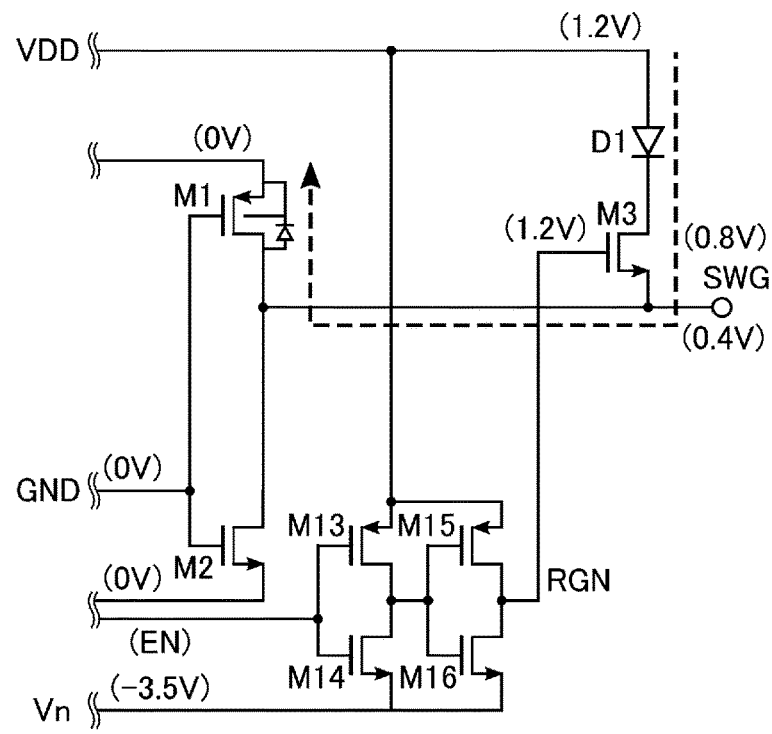
F I G. 20

SEMICONDUCTOR DEVICE

CROSS-REFERENCE TO RELATED APPLICATION

This application is based upon and claims the benefit of priority from prior Japanese Patent Application No. 2023-131410, filed Aug. 10, 2023, the entire contents of which are incorporated herein by reference.

FIELD

Embodiments described herein relate generally to a semiconductor device.

BACKGROUND

A semiconductor device including a high-frequency switch is known.

BRIEF DESCRIPTION OF THE DRAWINGS

FIG. 1 is a block diagram illustrating a configuration of a wireless device including a switch circuit of a first embodiment.

FIG. 2 is a circuit diagram illustrating a configuration of the switch circuit of the first embodiment.

FIG. 5 is a circuit diagram illustrating a configuration of a switch circuit of a second embodiment.

FIG. 6 is a circuit diagram illustrating a configuration of a switch circuit of a modification of the second embodiment.

FIG. 7 is a circuit diagram illustrating a configuration of a switch circuit of another modification of the second embodiment.

FIG. 8 is a circuit diagram illustrating a configuration of a switch circuit of a third embodiment.

FIG. 9 is a circuit diagram illustrating a configuration of a switch circuit of a fourth embodiment.

FIG. 10 is a circuit diagram illustrating a configuration of a delay circuit included in a plurality of switch circuits of a fifth embodiment.

FIG. 11 is a circuit diagram illustrating a configuration of a delay circuit included in a plurality of switch circuits of a sixth embodiment.

FIG. 12 is a timing chart illustrating an operation of a switch control circuit in the switch circuit of the sixth embodiment.

FIG. 16 is a circuit diagram illustrating a part of an operation of an ON/OFF switch circuit in the switch circuit of the seventh embodiment.

FIG. 17 is a circuit diagram illustrating a configuration of a switch circuit of an eighth embodiment.

FIG. 18 is a circuit diagram illustrating a part of an operation of an ON/OFF switch circuit in the switch circuit of the eighth embodiment.

FIG. 19 is a circuit diagram illustrating a configuration of a switch circuit of a ninth embodiment.

FIG. 20 is a circuit diagram illustrating a part of an operation of an ON/OFF switch circuit in the switch circuit of the ninth embodiment.

DETAILED DESCRIPTION

Figure 3:
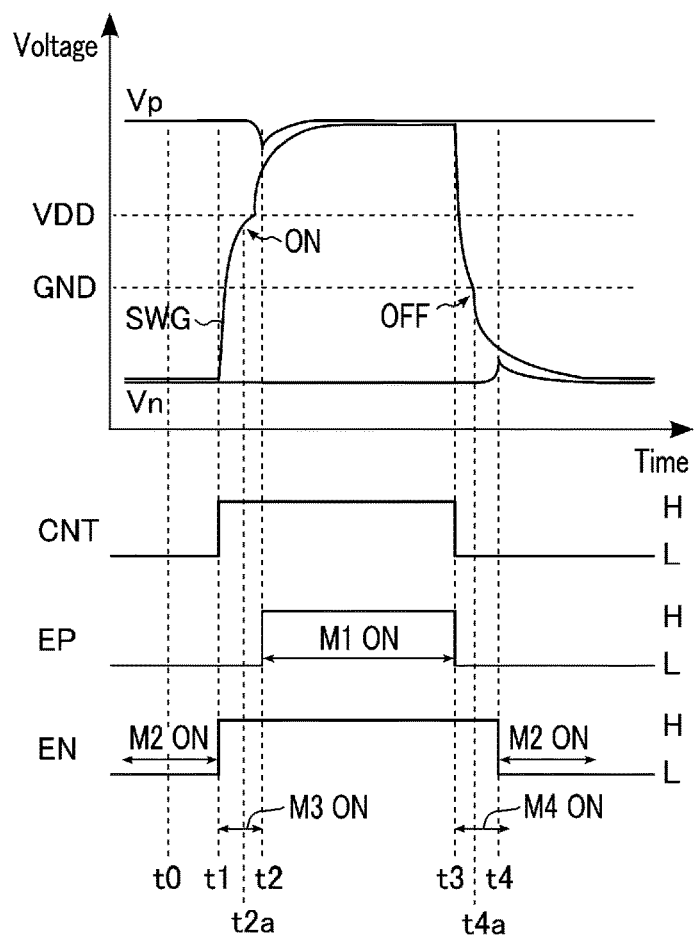
FIG. 3 is a timing chart illustrating an operation of a switch control circuit in the switch circuit of the first embodiment.

In general, according to one embodiment, a semiconductor device includes a first transistor, a second transistor, a third transistor, a fourth transistor, a first level shifter, and a second level shifter. The first transistor is configured to be supplied with a first voltage higher than a power supply voltage and to supply the first voltage to a first terminal. The second transistor is configured to be supplied with a second voltage lower than a ground voltage and to supply the second voltage to the first terminal. The third transistor is configured to be supplied with the power supply voltage and to supply the power supply voltage to the first terminal. The fourth transistor is configured to be supplied with the ground voltage and to supply the ground voltage to the first terminal. The first level shifter is configured to convert the power supply voltage to the first voltage at a time when a first signal is the power supply voltage, and to output a second signal. The second level shifter is configured to convert the ground voltage to the second voltage at a time when a third signal is the ground voltage, and to output a fourth signal. At a time of outputting the first voltage from the first terminal, the power supply voltage is supplied to the first terminal from the third transistor in accordance with the fourth signal, and then the first voltage is supplied to the first terminal from the first transistor in accordance with the second signal. At a time of outputting the second voltage from the first terminal, the ground voltage is supplied to the first terminal from the fourth transistor in accordance with the second signal, and then the second voltage is supplied to the first terminal from the second transistor in accordance with the fourth signal.

Hereinafter, embodiments are described with reference to the accompanying drawings. In the description below, structural elements with identical functions and structures are denoted by like reference signs. In addition, the embodiments to be described below exemplarily illustrate devices and methods for embodying technical concepts of the embodiments, and do not specifically restrict the materials, shapes, structures, arrangements and the like of the structural components to those described below.

Functional blocks can be implemented by hardware, computer software, or a combination of hardware and computer software. It is not necessary that the functional blocks are distinguished as in examples described below. For example, some functions may be executed by functional blocks different from the functional blocks illustrated. In addition, a functional block illustrated may be divided into more specific functional sub-blocks.

1. First Embodiment

Hereinafter, a semiconductor device of a first embodiment is described. The semiconductor device includes a switch circuit 1.

1.1 Configuration of the First Embodiment

1.1.1 Wireless Device

FIG. 1 is a block diagram illustrating a configuration of a wireless device WD including the switch circuit 1 of the first embodiment. The wireless device WD is, for example, a smartphone, a future phone, a mobile terminal (for example, a tablet terminal), a personal computer, a game console, a router, a base station, or the like. The wireless device WD transmits and receives signals by using communication standards such as LTE (trademark) (Long Term Evolution) and/or WiFi.

The wireless device WD includes, for example, an antenna ANT, switch circuits 1, 2, 3 and 4, signal processing circuits 5 and 6, a control circuit 7, and a power supply circuit 8. In the wireless device WD, for example, the switch circuits 1, 2, 3 and 4 and the power supply circuit 8 are mounted on one semiconductor substrate, thereby constituting a semiconductor device (or a semiconductor package, or an IC chip). Although FIG. 1 illustrates an example in which the power supply circuit 8 is provided outside the switch circuits 1, 2, 3 and 4, the power supply circuit 8 may be provided inside the switch circuit.

The antenna ANT receives a high-frequency signal from some other device (for example, a base station or another wireless device). The antenna ANT can also transmit a high-frequency signal from the wireless device WD to some other device.

The control circuit 7 transmits control signals CNT (including CNT1, CNT2, CNT3 and CNT4) to, for example, the switch circuits 1, 2, 3 and 4 and the signal processing circuits 5 and 6. Whether each of the switch circuits 1, 2, 3 and 4 is in the ON state or in the OFF state is controlled by the control signal CNT that is transmitted from the control circuit 7. While a certain switch circuit is in the ON state, this switch circuit can transmit a signal between a first end and a second end of the switch circuit. On the other hand, while a certain switch circuit is in the OFF state, this switch circuit does not transmit a signal between a first end and a second end of the switch circuit. Each of the signal processing circuits 5 and 6 processes a signal, based on the control signal CNT received from the control circuit 7.

A first end of the switch circuit 1 is connected to the antenna ANT, and a second end of the switch circuit 1 is connected to the signal processing circuit 5. The switch circuit 1 receives the control signal CNT1 from the control circuit 7. While the switch circuit 1 is set in the ON state, based on the control signal CNT1, the switch circuit 1 transmits, for example, a high-frequency signal received via the antenna ANT, to the signal processing circuit 5.

A first end of the switch circuit 2 is connected to a signal path between the switch circuit 1 and the signal processing circuit 5. A second end of the switch circuit 2 is connected to, for example, a node to which a ground voltage GND is supplied (hereinafter referred to as "ground voltage GND node"). In other words, the second end of the switch circuit 2 is grounded.

The switch circuit 2 receives the control signal CNT2 from the control circuit 7. For example, while the switch circuit 1 is set in the OFF state, the switch circuit 2 is set in the ON state, based on the control signal CNT2. While the switch circuit 2 is set in the ON state, the switch circuit 2 sets the potential of the signal path between the switch circuit 1 and the signal processing circuit 5 at a ground voltage.

The signal processing circuit 5 receives the high-frequency signal that is transmitted via the switch circuit 1, and executes various processes on the high-frequency signal, based on the control signal CNT3 received from the control circuit 7.

A first end of the switch circuit 3 is connected to the antenna ANT, and a second end of the switch circuit 3 is connected to the signal processing circuit 6. The switch circuit 3 receives, for example, the control signal CNT2 from the control circuit 7. While the switch circuit 3 is set in the ON state, based on the control signal CNT2, the switch circuit 3 transmits, for example, a high-frequency signal received via the antenna ANT, to the signal processing circuit 6. A frequency band of the high-frequency signal that the switch circuit 3 transmits is different from, for example, a frequency band of the high-frequency signal that the switch circuit 1 transmits. The switch circuit 1 and the switch circuit 3 are selectively set in the ON state, for example, under the control by the control circuit 7.

A first end of the switch circuit 4 is connected to a signal path between the switch circuit 3 and the signal processing circuit 6. A second end of the switch circuit 4 is, for example, grounded. The switch circuit 4 receives the control signal CNT1 from the control circuit 7. For example, while the switch circuit 3 is set in the OFF state, the switch circuit 4 is set in the ON state, based on the control signal CNT1. While the switch circuit 4 is set in the ON state, the switch circuit 4 sets the potential of the signal path between the switch circuit 3 and the signal processing circuit 6 at a ground potential.

The signal processing circuit 6 receives the high-frequency signal that is transmitted via the switch circuit 3, and executes various processes on the high-frequency signal, based on the control signal CNT4 received from the control circuit 7.

The power supply circuit 8 is provided in the semiconductor device including the switch circuit 1, and generates a high voltage Vp and a low voltage Vn by using a power supply voltage VDD and a ground voltage GND, which are supplied from the outside of the semiconductor device. Note that, as described above, the power supply circuit 8 may be provided inside the switch circuit 1, or may be provided outside the switch circuit 1. The power supply circuit 8 includes, for example, a charge pump. The high voltage Vp is, for example, about 3 V to 5 V, and it is assumed here that the high voltage Vp is 3.5 V. The low voltage Vn is, for example, about −4 V to −2 V, and it is assumed here that the low voltage Vn is −3.5 V.

In the above, the case was described in which each of the switch circuits 1 and 3 transmits the high-frequency signal that the wireless device WD receives from some other device. The switch circuits 1 and 3 are not limited to this. Each of the switch circuits 1 and 3 may transmit a high-frequency signal that the wireless device WD transmits to some other device.

1.1.2 Switch Circuit

Next, the switch circuit 1 of the first embodiment is described. FIG. 2 is a circuit diagram illustrating a configuration of the switch circuit of the first embodiment. The configuration of each of the switch circuits 2, 3 and 4 is similar to, for example, the configuration of the switch circuit 1.

The switch circuit 1 includes a switch control circuit 10 and a high-frequency switch 20. The switch control circuit 10 executes control to switch the high-frequency switch 20 from the ON state to the OFF state, or from the OFF state to the ON state. The switching from the ON state to the OFF state, and from the OFF state to the ON state, are also referred to as "ON/OFF switching".

The high-frequency switch 20 is, for example, a switch that switches a path of a high-frequency signal. The ON state of the high-frequency switch 20 is a state in which all transistors connected between a first end and a second end are turned on, and the first end and the second end are electrically connected. The OFF state of the high-frequency switch 20 is a state in which any one of the switch transistors is turned off, and the first end and the second end are electrically disconnected. The details of the high-frequency switch 20 will be described later.

Hereinafter, the switch control circuit 10 is described. The switch control circuit 10 includes an ON/OFF switch circuit 11 and delay circuit 12.

The ON/OFF switch circuit 11 outputs, from a terminal TSW, a switch signal SWG for setting the high-frequency switch 20 in the ON state or in the OFF state. The ON/OFF switch circuit 11 receives the control signal CNT from the control circuit 7. Based on the control signal CNT, the ON/OFF switch circuit 11 outputs a voltage Vp or a voltage Vn as the switch signal SWG. If the voltage Vp is output as the switch signal SWG, the high-frequency switch 20 is set in the ON state. On the other hand, if the voltage Vn is output as the switch signal SWG, the high-frequency switch 20 is set in the OFF state.

The delay circuit 12 generates a signal EN and a signal EP from the control signal CNT. The signal EN is a signal that rises from "L" level to "H" level at the same time as the control signal CNT, and falls from "H" level to "L" level with a delay from the control signal CNT. The signal EP is a signal that rises from "L" level to "H" level with a delay from the control signal CNT, and falls from "H" level to "L" level at the same time as the control signal CNT.

Hereinafter, the circuit configuration and the connections of circuit elements in the switch control circuit 10 are described.

The ON/OFF switch circuit 11 includes p-channel MOS field-effect transistors (hereinafter referred to as "pMOS transistors") M1, M4, M5, M7, M9, M11, M13 and M15; n-channel MOS field-effect transistors (hereinafter "nMOS transistors) M2, M3, M6, M8, M10, M12, M14 and M16; buffers B1, B2, B3 and B4; and diodes D1 and D2.

The signal EP is input to an input end of the buffer B1. An output end of the buffer B1 is connected to an input end of the buffer B2. An output end of the buffer B2 is connected to gates of the pMOS transistor M5 and the nMOS transistor M6.

A first power supply end of the buffer B1 is connected to a node supplied with the power supply voltage VDD (hereinafter referred to as "power supply voltage VDD node"). The power supply voltage VDD is supplied to the power supply voltage VDD node from the outside of the semiconductor device. A second power supply end of the buffer B1 is connected to the ground voltage GND node. The ground voltage GND is supplied to the ground voltage GND node from the outside of the semiconductor device. At a time when the signal EP is at "H" level, the buffer B1 outputs the power supply voltage VDD as "H" level, and at a time when the signal EP is at "L" level, the buffer B1 outputs the ground voltage GND as "L" level.

A first power supply end of the buffer B2 is connected to a node supplied with the voltage Vp (hereinafter referred to as "voltage Vp node"). The voltage Vp is supplied to the voltage Vp node from the power supply circuit 8. A second power supply end of the buffer B2 is connected to the ground voltage GND node. At a time when the output of the buffer B1 is the power supply voltage VDD, the buffer B2 outputs the voltage Vp as "H" level, and at a time when the output of the buffer B1 is the ground voltage GND, the buffer B2 outputs the ground voltage GND as "L" level. The buffer B1 and buffer B2 constitute a level shifter LS1.

The drains of the pMOS transistor M5 and nMOS transistor M6 are connected to the gates of the pMOS transistor M7 and nMOS transistor M8. The drains of the pMOS transistor M7 and nMOS transistor M8 are connected to the source of the pMOS transistor M1 and to the gate of the pMOS transistor M4. A signal RGP corresponding to the signal EP is output from the drains of the pMOS transistor M7 and nMOS transistor M8.

The sources of the pMOS transistors M5 and M7 are connected to the voltage Vp node. The sources of the nMOS transistors M6 and M8 are connected to the ground voltage GND node.

The drain of the pMOS transistor M1 is connected to the drain of the nMOS transistor M2 and to the terminal TSW. The gates of the pMOS transistors M1 and M2 are connected to the ground voltage GND node.

The drain of the nMOS transistor M3 is connected to the cathode of the diode D1, and the anode of the diode D1 is connected to the power supply voltage VDD node. The drain of the pMOS transistor M4 is connected to the anode of the diode D2, and the cathode of the diode D2 is connected to the ground voltage GND node. The sources of the nMOS transistor M3 and pMOS transistor M4 are connected to the terminal TSW. The switch signal SWG is output from the terminal TSW.

The signal EN is input to an input end of the buffer B3. An output end of the buffer B3 is connected to an input end of the buffer B4. An output end of the buffer B4 is connected to the gates of the pMOS transistor M9 and nMOS transistor M10.

A first power supply end of the buffer B3 is connected to the power supply voltage VDD node. A second power supply end of the buffer B3 is connected to the ground voltage GND node. At a time when the signal EN is at "H" level, the buffer B3 outputs the power supply voltage VDD as "H" level, and at a time when the signal EN is at "L" level, the buffer B3 outputs the ground voltage GND as "L" level.

A first power supply end of the buffer B4 is connected to the power supply voltage VDD node. A second power supply end of the buffer B4 is connected to a node supplied with the voltage Vn (hereinafter referred to as "voltage Vn node"). The voltage Vn is supplied to the voltage Vn node from the power supply circuit 8. At a time when the output of the buffer B3 is the power supply voltage VDD, the buffer B4 outputs the power supply voltage VDD as "H" level, and at a time when the output of the buffer B3 is the ground voltage GND, the buffer B4 outputs the voltage Vn as "L" level. The buffers B3 and buffer B4 constitute a level shifter LS2.

The drains of the pMOS transistor M9 and nMOS transistor M10 are connected to the gates of the pMOS transistor M11 and nMOS transistor M12. The drains of the pMOS transistor M11 and nMOS transistor M12 are connected to the source of the nMOS transistor M2. The sources of the pMOS transistors M9 and M11 are connected to the ground voltage GND node. The sources of the nMOS transistors M10 and M12 are connected to the voltage Vn node.

The output end of the buffer B4 is also connected to the gates of the pMOS transistor M13 and nMOS transistor M14. The drains of the pMOS transistor M13 and nMOS transistor M14 are connected to the gates of the pMOS transistor M15 and nMOS transistor M16. The drains of the pMOS transistor M15 and nMOS transistor M16 are connected to the gate of the nMOS transistor M3. A signal RGN corresponding to the signal EN is output from the drains of the pMOS transistor M15 and nMOS transistor M16.

The sources of the pMOS transistors M13 and M15 are connected to the power supply voltage VDD node. The sources of the nMOS transistors M14 and M16 are connected to the voltage Vn node.

The delay circuit 12 includes buffers B5 and B6, a resistance element R, a capacitance element C, an AND circuit AD1, and an OR circuit OR1.

The control signal CNT is input to an input end of the buffer B5. An output end of the buffer B5 is connected to a first input end of the AND circuit AD1, a first input end of the OR circuit OR1, and an input end of the buffer B6. A first power supply end of the buffer B5 is connected to the power supply voltage VDD node. A second power supply end of the buffer B5 is connected to the ground voltage GND node. Similarly, a first power supply end of the buffer B6 is connected to the power supply voltage VDD node. A second power supply end of the buffer B6 is connected to the ground voltage GND node.

An output end of the buffer B6 is connected to one end of the resistance element R. The other end of the resistance element R is connected to a first electrode of the capacitance element C, a second input end of the AND circuit AD1, and a second input end of the OR circuit OR1. A second electrode of the capacitance element C is connected to the ground voltage GND node. The signal EP is output from an output end of the AND circuit AD1, and the signal EN is output from an output end of the OR circuit OR1.

Next, referring to FIG. 2, the circuit configuration and the connections of circuit elements in the high-frequency switch 20 are described. In FIG. 2, a first end and a second end of the high-frequency switch 20 are illustrated as a terminal T1 and a terminal T2, respectively.

The high-frequency switch 20 includes nMOS transistors N1_1, N1_2, N1_3, . . . , N1_(n−1), and N1_n, and resistance elements R1_1, R1_2, R1_3, . . . , R1_(n−1), and R1_n. Note that n is an integer of 1 or more. Each of the number of transistors included in the high-frequency switch 20 and the number of resistance elements included in the high-frequency switch 20 is freely chosen, and is one or plural.

In addition, although the circuit sign of each transistor is illustrated such that one certain end of the transistor is a drain and the other end is a source, the drain and the source can be interchanged, depending on the relationship in potential between the one end and the other end. The resistance values of the resistance elements R1_1 to R1_n are, for example, substantially identical. Hereinafter, a case is described in which the resistance values of the resistance elements R1_1 to R1_n are substantially identical.

The current paths of the nMOS transistors N1_1, N1_2, N1_3, . . . , N1_n are connected in series between the terminal T1 and terminal T2. Specific connections are as follows. The drain of the nMOS transistor N1_1 is connected to the terminal T1, and the drain of the nMOS transistor N1_2 is connected to the source of the nMOS transistor N1_1. The drain of the nMOS transistor N1_3 is connected to the source of the nMOS transistor N1_2, and the drain of the nMOS transistor N1_4 is connected to the source of the nMOS transistor N1_3. The connection relation of the subsequent nMOS transistors N1_4, N1_5, . . . , N1_n is similar, and the terminal T2 is connected to the source of the nMOS transistor N1_n.

The resistance element R1_1 is connected between the gate (or the control end) of the nMOS transistor N1_1 and the gate of the nMOS transistor N1_2. The resistance element R1_2 is connected between the gate of the nMOS transistor N1_2 and the gate of the nMOS transistor N1_3. The resistance element R1_3 is connected between the gate of the nMOS transistor N1_3 and the gate of the nMOS transistor N1_4. The connection relation of the subsequent resistance elements R1_4, R1_5, . . . , R1_n is similar. Further, one end of the resistance element R1_n is connected to the gate of the nMOS transistor N1_n, and the terminal TSW is connected to the other end of the resistance element R1_n.

1.2 Operation of the First Embodiment

Next, an operation of the switch circuit 1 of the first embodiment is described.

FIG. 3 is a timing chart illustrating an operation of the switch control circuit 10 in the switch circuit 1 of the first embodiment.

In a case of switching the high-frequency switch 20 from the OFF state to the ON state, the switch signal SWG that is output from the terminal TSW of the switch control circuit 10 is set to the voltage Vp from the voltage Vn. On the other hand, in a case of switching the high-frequency switch 20 from the ON state to the OFF state, the switch signal SWG that is output from the terminal TSW of the switch control circuit 10 is set to the voltage Vn from the voltage Vp.

In the present embodiment, in the case of switching the high-frequency switch 20 from the OFF state to the ON state, the power supply voltage VDD (for example, 1.2 V) is supplied to the terminal TSW before the voltage Vp (for example, 3.5 V) is supplied to the terminal TSW. Then, if the voltage of the terminal TSW rises to the neighborhood of the power supply voltage VDD, the voltage Vp is supplied to the terminal TSW. In this manner, in the case of raising the switch signal SWG from the voltage Vn to the voltage Vp, the switch signal SWG is first raised from the voltage Vn to the power supply voltage VDD by supplying the power supply voltage VDD to the terminal TSW, and then the switch signal SWG is raised from the power supply voltage VDD to the voltage Vp by supplying the voltage Vp to the terminal TSW. Thereby, even in the case where the driving power of the power supply circuit 8 that supplies Vp is not sufficient, the switch signal SWG can be raised from the voltage Vn to the voltage Vp, without lowering the voltage Vp at the time of supplying the voltage Vp. This prevents the transition of the switch signal SWG from the voltage Vn to the voltage Vp from delaying due to the lowering of the voltage Vp that occurs in the case where the driving power of the power supply circuit 8 is not sufficient. Thereby, the time needed for the switch signal SWG to transition from the voltage Vn to the voltage Vp can be shortened.

In addition, in the case of switching the high-frequency switch 20 from the ON state to the OFF state, the ground voltage GND (for example, 0 V) is supplied to the terminal TSW before the voltage Vn (for example, −3.5 V) is supplied to the terminal TSW. Then, if the voltage of the terminal TSW falls to the neighborhood of the ground voltage GND, the voltage Vn is supplied to the terminal TSW. In this manner, in the case of lowering the switch signal SWG from the voltage Vp to the voltage Vn, the switch signal SWG is first lowered from the voltage Vp to the ground voltage GND by supplying the ground voltage GND to the terminal TSW, and then the switch signal SWG is lowered from the ground voltage GND to the voltage Vn by supplying the voltage Vn to the terminal TSW. Thereby, even in the case where the driving power of the power supply circuit 8 that supplies Vn is not sufficient, the switch signal SWG can be lowered from the voltage Vp to the voltage Vn, without raising the voltage Vn at the time of supplying the voltage Vn. This prevents the transition of the switch signal SWG from the voltage Vp to the voltage Vn from delaying due to the rising of the voltage Vn that occurs in the case where the driving power of the power supply circuit 8 is not sufficient. Thereby, the time needed for the switch signal SWG to transition from the voltage Vp to the voltage Vn can be shortened.

Hereinafter, the operations of a case (1) of switching the high-frequency switch 20 from the OFF state to the ON state and a case (2) of switching the high-frequency switch 20 from the ON state to the OFF state are successively described in detail.

(1) Case of Switching from the OFF State to ON State

To start with, at time t0, the voltage Vn (for example, −3.5 V) is being output as the signal SWG from the terminal TSW of the switch control circuit 10. Thereby, the high-frequency switch 20 is set in the OFF state. At this time, the control signal CNT that is input to the delay circuit 12 in the switch control circuit 10 is "L" (for example, 0 V), and the signals EP and EN are also "L". Thereby, the transistor M2 is set in the ON state, and the transistors M1, M3 and M4 are set in the OFF state.

Next, at time t1, the control signal CNT rises from "L" to "H" (for example, power supply voltage VDD). Then, the signal EN rises from "L" to "H", and the signal EP is kept at "L". Thus, the transistor M3 is set in the ON state, and the transistors M1, M2 and M4 are set in the OFF state. Thereby, electric charge flows from the power supply voltage VDD node into the terminal TSW via the diode D1 and transistor M3, and the terminal TSW is charged. As a result, as illustrated in FIG. 3, the voltage of the signal SWG rises, and, at time t2a, if the voltage of the signal SWG reaches a first voltage (for example, 0.7 V), the high-frequency switch 20 is switched from the OFF state to the ON state.

Next, at time t2, the signal EP rises from "L" to "H", and the signal EN is kept at "H". Thus, the transistor M1 is set in the ON state, and the transistors M2, M3 and M4 are set in the OFF state. Thereby, electric charge flows from the voltage Vp node into the terminal TSW via the transistor M1, and the terminal TSW is further charged. As a result, as illustrated in FIG. 3, the voltage of the signal SWG further rises to the voltage Vp, and the high-frequency switch 20 is stably kept in the ON state.

(2) Case of Switching from the ON State to OFF State

Thereafter, at time t3, the control signal CNT falls from "H" to "L". Then, the signal EP falls from "H" to "L", and the signal EN is kept at "H". Thus, the transistor M4 is set in the ON state, and the transistors M1, M2 and M3 are set in the OFF state. Thereby, the electric charge of the terminal TSW is released to the ground voltage GND node via the transistor M4 and diode D2, and the terminal TSW is discharged. As a result, as illustrated in FIG. 3, the voltage of the signal SWG lowers, and, at time t4a, if the voltage of the signal SWG reaches a certain second voltage, the high-frequency switch 20 is switched from the ON state to the OFF state.

Next, at time t4, the signal EN falls from "H" to "L", and the signal EP is kept at "L". Thus, the transistor M2 is set in the ON state, and the transistors M1, M3 and M4 are set in the OFF state. Thereby, the electric charge of the terminal TSW is released to the voltage Vn node via the transistor M2, and the terminal TSW is further discharged. As a result, as illustrated in FIG. 3, the voltage of the signal SWG further falls to the voltage Vn, and the high-frequency switch 20 is stably kept in the OFF state.

As has been described above, at the time when the high-frequency switch 20 is set in the ON state, the transistor M1 is set in the ON state and the transistor M2 is set in the OFF state, and the voltage Vp is output to the high-frequency switch 20 as the switch signal SWG from the terminal TSW of the switch control circuit 10.

In the case of switching the high-frequency switch 20 from the OFF state to the ON state, before the transistor M1 is set in the ON state and the transistor M2 is set in the OFF state, the transistors M1 and M2 are set in the OFF state and the transistor M3 is set in the ON state. During this period, the power supply voltage VDD is supplied to the terminal TSW from the power supply voltage VDD node. Thereafter, the transistor M1 is set in the ON state and the transistors M2, M3 and M4 are set in the OFF state. During this period, the voltage Vp is supplied from the voltage Vp node to the terminal TSW. Thereby, the signal SWG quickly transitions from the voltage Vn to the voltage Vp. Thereby, the high-frequency switch 20 is quickly switched from the OFF state to the ON state.

In addition, at the time when the high-frequency switch 20 is set in the OFF state, the transistor M2 is set in the ON state and the transistor M1 is set in the OFF state, and the voltage Vn is output to the high-frequency switch 20 as the switch signal SWG from the terminal TSW of the switch control circuit 10.

In the case of switching the high-frequency switch 20 from the ON state to the OFF state, before the transistor M2 is set in the ON state and the transistor M1 is set in the OFF state, the transistors M1 and M2 are set in the OFF state and the transistor M4 is set in the ON state. During this period, electric current is drawn into the ground voltage GND node from the terminal TSW. Thereafter, the transistor M2 is set in the ON state and the transistors M1, M3 and M4 are set in the OFF state. During this period, electric current is drawn into the voltage Vn node from the terminal TSW. Thereby, the signal SWG quickly transitions from the voltage Vp to the voltage Vn. Thereby, the high-frequency switch 20 is quickly switched from the ON state to the OFF state.

Besides, the diode D1 is provided between the drain of the nMOS transistor M3 and the power supply voltage VDD node. The diode D1 prevents reverse current that flows to the power supply voltage VDD node via a parasitic diode of the nMOS transistor M3 from the terminal TSW, at a time when the high-frequency switch 20 is set in the ON state, that is, at a time when the signal SWG is the voltage Vp.

Similarly, the diode D2 is provided between the drain of the pMOS transistor M4 and the ground voltage GND node. The diode D2 prevents reverse current that flows to the terminal TSW via a parasitic diode of the pMOS transistor M4 from the ground voltage GND node, at a time when the high-frequency switch 20 is set in the OFF state, that is, at a time when the signal SWG is the voltage Vn.

1.3 Advantageous Effects of the First Embodiment

According to the first embodiment, a semiconductor device capable of quickening ON/OFF switching of a high-frequency switch can be provided.

Hereinafter, referring to FIG. 4, a switch circuit of a comparative example is described, and then advantageous effects of the first embodiment are described.

Figure 4:
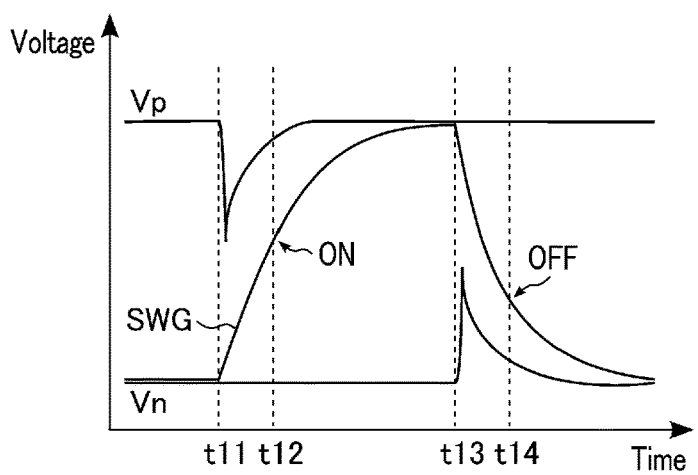
FIG. 4 is a timing chart illustrating an operation of a switch control circuit in a switch circuit of a comparative example.

FIG. 4 is a timing chart illustrating an operation of a switch control circuit in the switch circuit of the comparative example.

In the comparative example, in the case of switching the high-frequency switch from the OFF state to the ON state, at time t11, the voltage Vp is supplied from the power supply circuit 8 to the terminal TSW. However, in the case where the driving power of the power supply circuit 8 is not sufficient, as illustrated in FIG. 4, the voltage of the voltage Vp supplied from the power supply circuit 8 conspicuously decreases. Thus, the rising of the signal SWG from the voltage Vn to the voltage Vp delays, and, for example, at time t12, at a time point when the signal SWG rises to a first voltage, the high-frequency switch is switched from the OFF state to the ON state. Accordingly, the switching of the high-frequency switch from the OFF state to the ON state delays.

On the other hand, in the case of switching the high-frequency switch from the ON state to the OFF state, at time t13, the voltage Vn is supplied from the power supply circuit 8 to the terminal TSW. In other words, current flows into the voltage Vn node from the terminal TSW. However, in the case where the driving power of the power supply circuit 8 is not sufficient, as illustrated in FIG. 4, the voltage of the voltage Vn supplied from the power supply circuit 8 conspicuously increases. Thus, the falling of the signal SWG from the voltage Vp to the voltage Vn delays, and, for example, at time t14, at a time point when the signal SWG falls to a second voltage, the high-frequency switch is switched from the ON state to the OFF state. Accordingly, the switching of the high-frequency switch from the ON state to the OFF state delays.

By contrast, in the first embodiment, the following operation is performed in the case of switching the high-frequency switch from the OFF state to the ON state, or from the ON state to the OFF state.

In the case of switching the high-frequency switch 20 from the OFF state to the ON state, the power supply voltage VDD that is supplied from the outside of the semiconductor device is first supplied to the terminal TSW. Thereafter, the voltage Vp that is output from the power supply circuit 8 in the semiconductor device is supplied to the terminal TSW. In this manner, even in the case where the driving power of the power supply circuit 8 that supplies Vp is not sufficient, the power supply voltage VDD and the voltage Vp are switched in two steps and supplied to the terminal TSW, and thereby the switch signal SWG can be raised from the voltage Vn to the voltage Vp, without lowering the voltage Vp at the time of supplying the voltage Vp. Thereby, the switching of the high-frequency switch 20 from the OFF state to the ON state can be quickened. In other words, the switching time of the high-frequency switch 20 from the OFF state to the ON state can be shortened.

In addition, in the case of switching the high-frequency switch 20 from the ON state to the OFF state, the ground voltage GND that is supplied from the outside of the semiconductor device is first supplied to the terminal TSW. Thereafter, the voltage Vn that is output from the power supply circuit 8 in the semiconductor device is supplied to the terminal TSW. In this manner, even in the case where the driving power of the power supply circuit 8 that supplies Vn is not sufficient, the ground voltage GND and the voltage Vn are switched in two steps and supplied to the terminal TSW, and thereby the switch signal SWG can be lowered from the voltage Vp to the voltage Vn, without raising the voltage Vn at the time of supplying the voltage Vn. Thereby, the switching of the high-frequency switch 20 from the ON state to the OFF state can be quickened. In other words, the switching time of the high-frequency switch 20 from the ON state to the OFF state can be shortened.

2. Second Embodiment

Next, a semiconductor device of a second embodiment is described. In the second embodiment, a circuit including nMOS transistors and resistance elements is added to the high-frequency switch 20 in the first embodiment. In addition, a signal that is supplied to these nMOS transistors and resistance elements is prepared. In the second embodiment, the description of similar points to the configuration, operation and advantageous effects of the switch circuit 1 of the first embodiment is omitted, and different points are mainly described.

2.1 Configuration of the Second Embodiment

FIG. 5 is a circuit diagram illustrating a configuration of a switch circuit of the second embodiment.

A switch circuit 1 of the second embodiment is different from the configuration of the first embodiment with respect to an ON/OFF switch circuit 11a included in the switch control circuit 10, and a high-frequency switch 20a. Specifically, the differences are as follows.

The ON/OFF switch circuit 11a includes a terminal TRN connected to the drains of the pMOS transistor M15 and nMOS transistor M16. A signal RGN corresponding to the signal EN is output from the terminal TRN.

In addition to the configuration of the high-frequency switch 20 illustrated in FIG. 2, the high-frequency switch 20a includes, for example, nMOS transistors N2_1, N2_2, N2_3, ..., N2_(n−1), and N2_n, and resistance elements R2_1, R2_2, R2_3, ..., R2_(n−1), and R2_n.

In the high-frequency switch 20a, the nMOS transistor N2_1 that can short-circuit both ends of the resistance element R1_1 is provided. The nMOS transistor N2_2 that can short-circuit both ends of the resistance element R1_2 is provided. The nMOS transistor N2_3 that can short-circuit both ends of the resistance element R1_3 is provided. The subsequent nMOS transistors N2_4, N2_5, ..., N2_(n−1), and N2_n are similarly provided. Further, the gates of the nMOS transistors N2_1, N2_2, N2_3, ..., N2_(n−1), and N2_n are provided with the resistance elements R2_1, R2_2, R2_3, ..., R2_(n−1), and R2_n, respectively.

Hereinafter, the connections of the circuit elements in the high-frequency switch 20a are described.

The drain and source of the nMOS transistor N2_1 are connected between the gate of the nMOS transistor N1_1 and the gate of the nMOS transistor N1_2. In other words, the drain of the nMOS transistor N2_1 is connected to the gate of the nMOS transistor N1_1, and the source of the nMOS transistor N2_1 is connected to the gate of the nMOS transistor N1_2. The drain and source of the nMOS transistor N2_2 are connected between the gate of the nMOS transistor N1_2 and the gate of the nMOS transistor N1_3. In other words, the drain of the nMOS transistor N2_2 is connected to the gate of the nMOS transistor N1_2, and the source of the nMOS transistor N2_2 is connected to the gate of the nMOS transistor N1_3. The drain and source of the nMOS transistor N2_3 are connected between the gate of the nMOS transistor N1_3 and the gate of the nMOS transistor N1_4. In other words, the drain of the nMOS transistor N2_3 is connected to the gate of the nMOS transistor N1_3, and the source of the nMOS transistor N2_3 is connected to the gate of the nMOS transistor N1_4. Similar connections are established for the subsequent nMOS transistors N2_4, N2_5, ..., N2_(n-1). Further, the drain of the nMOS transistor N2_n is connected to the gate of the nMOS transistor N1_n, and the terminal TSW is connected to the source of the nMOS transistor N2_n.

The resistance element R2_1 is connected between the gate of the nMOS transistor N2_1 and the gate of the nMOS transistor N2_2. The resistance element R2_2 is connected between the gate of the nMOS transistor N2_2 and the gate of the nMOS transistor N2_3. The resistance element R2_3 is connected between the gate of the nMOS transistor N2_3 and the gate of the nMOS transistor N2_4. Similar connections are established for the subsequent resistance elements R2_4, R2_5, ..., R2_(n-1). Further, one end of the resistance element R2_n is connected to the gate of the nMOS transistor N2_n, and the terminal TRN is connected to the other end of the resistance element R2_n.

2.2 Operation of the Second Embodiment

In the case of switching the high-frequency switch 20a from the OFF state to the ON state, in the switch circuit 1 illustrated in FIG. 5, the signals SWG and RGN, which are output from the ON/OFF switch circuit 11a are input to the terminals TSW and TRN of the high-frequency switch 20a, respectively.

In the high-frequency switch 20a, the nMOS transistors N1_n, N1_(n-1), N1_(n-2), ..., N1_1 are successively turned on by the signal SWG that is input to the terminal TSW. In addition, the nMOS transistors N2_n, N2_(n-1), N2_(n-2), ..., N2_1 are successively turned on by the signal RGN that is input to the terminal TRN. Thereby, the resistance elements R1_n, R1_(n-1), R1_(n-2), ..., R1_1 are short-circuited by the nMOS transistors N2_n, N2_(n-1), N2_(n-2), ..., N2_1, and the OFF-to-ON transition of the nMOS transistors N1_n, N1_(n-1), N1_(n-2), ..., N1_1 is quickened. As a result, the switching of the high-frequency switch 20a from the OFF state to the ON state is quickened.

2.3 Advantageous Effects of the Second Embodiment

According to the second embodiment, a semiconductor device capable of quickening ON/OFF switching of a high-frequency switch can be provided.

Furthermore, in addition to the configuration of the first embodiment, the second embodiment includes the nMOS transistors N2_1 to N2_n for short-circuiting both ends of each of the resistance elements R1_1 to R1_n in the high-frequency switch 20a, and the signal RGN for controlling the ON and OFF of the nMOS transistors N2_1 to N2_n. Thereby, the time needed until all nMOS transistors N1_1 to N1_n in the high-frequency switch 20a are turned on can be shortened. As a result, the switching of the high-frequency switch 20a from the OFF state to the ON state can be quickened.

2.4 Modification of the Second Embodiment

Next, a switch circuit 1 of a modification of the second embodiment is described. FIG. 6 is a circuit diagram illustrating a configuration of the switch circuit of the modification of the second embodiment.

The switch circuit 1 of the modification is different from the configuration of the above-described second embodiment with respect to a high-frequency switch 20b. Specifically, the differences are as follows.

The high-frequency switch 20b includes a configuration in which the source and drain of each of the nMOS transistors N2_1, N2_2, N2_3, ..., N2_(n-1), and N2_n included in the high-frequency switch 20a illustrated in FIG. 5 are interchanged.

The source of the nMOS transistor N2_1 is connected to the gate of the nMOS transistor N1_1, and the drain of the nMOS transistor N2_1 is connected to the gate of the nMOS transistor N1_2. The source of the nMOS transistor N2_2 is connected to the gate of the nMOS transistor N1_2, and the drain of the nMOS transistor N2_2 is connected to the gate of the nMOS transistor N1_3. The source of the nMOS transistor N2_3 is connected to the gate of the nMOS transistor N1_3, and the drain of the nMOS transistor N2_3 is connected to the gate of the nMOS transistor N1_4. Similar connections are established for the subsequent nMOS transistors N2_4, N2_5, ..., N2_(n-1). Further, the source of the nMOS transistor N2_n is connected to the gate of the nMOS transistor N1_n, and the terminal TSW is connected to the drain of the nMOS transistor N2_n.

Also in the high-frequency switch 20b in which, compared to the high-frequency switch 20a, the source and drain of each of the nMOS transistors N2_1, N2_2, N2_3, ..., N2_(n-1), and N2_n are interchanged as described above, the operation of the high-frequency switch 20b is similar to the operation of the high-frequency switch 20a in the second embodiment.

2.5 Another Modification of the Second Embodiment

Next, a switch circuit 1 of another modification of the second embodiment is described. FIG. 7 is a circuit diagram illustrating a configuration of the switch circuit of the another modification of the second embodiment.

The switch circuit 1 of the another modification is different from the configuration of the above-described second embodiment with respect to a high-frequency switch 20c. Specifically, the differences are as follows.

In addition to the configuration of the high-frequency switch 20 illustrated in FIG. 2, the high-frequency switch 20c includes, for example, nMOS transistors N2_1, N2_2, N2_3, ..., N2_(n-1), N2_n, and N2_(n+1), and resistance elements R2_1, R2_2, R2_3, ..., R2_(n-1), R2_n, R2_(n+1), and R2_(n+2).

The source of the nMOS transistor N2_(n+1) and one end of the resistance element R2_(n+1) are connected to the terminal TSW. The drain of the nMOS transistor N2_(n+1) is connected to the other end of the resistance element R2_(n+1).

The nMOS transistor N2_1 and the resistance element R1_1 are connected in parallel between a first node, to which the drain of the nMOS transistor N2_(n+1) and the other end of the resistance element R2_(n+1) are connected, and the gate of the nMOS transistor N1_1. The nMOS transistor N2_2 and the resistance element R1_2 are connected in parallel between the first node and the gate of the nMOS transistor N1_2. The nMOS transistor N2_3 and the resistance element R1_3 are connected in parallel between the first node and the gate of the nMOS transistor N1_3. Similar connections are established for the nMOS transistor N2_4 and resistance element R1_4, ..., the nMOS transistor N2_(n-1) and resistance element R1_(n-1), and the nMOS transistor N2_n and resistance element R1_n.

The gate of the nMOS transistor N2_1 is connected to the terminal TRN via the resistance elements R2_1 and R2_(n+2). The gate of the nMOS transistor N2_2 is connected to the terminal TRN via the resistance elements R2_2 and R2_(n+2). The gate of the nMOS transistor N2_3 is connected to the terminal TRN via the resistance elements R2_3 and R2_(n+2). Similarly, the gate of the nMOS transistor N2_4 is connected to the terminal TRN via the resistance elements R2_4 and R2_(n+2), the gate of the nMOS transistor N2_(n−1) is connected to the terminal TRN via the resistance elements R2_(n−1) and R2_(n+2), and the gate of the nMOS transistor N2_n is connected to the terminal TRN via the resistance elements R2_n and R2_(n+2). Further, the gate of the nMOS transistor N2_(n+1) is connected to the terminal TRN via the resistance element R2_(n+2).

Also in the case where the nMOS transistor and the resistance element are connected in parallel to the gate of each of the nMOS transistors N1_1, N1_2, N1_3, ..., N1_(n−1), and N1_n, as described above, the nMOS transistors N2_n, N2_(n−1), N2_(n−2), ..., N2_1 are turned on by the signal RGN that is input to the terminal TRN. Thereby, the resistance elements R1_n, R1_(n−1), R1_(n−2), ..., R1_1 are short-circuited by the nMOS transistors N2_n, N2_(n−1), N2_(n−2), ..., N2_1, and the OFF-to-ON transition of the nMOS transistors N1_n, N1_(n−1), N1_(n−2), ..., N1_1 is quickened. As a result, the switching of the high-frequency switch 20c from the OFF state to the ON state is quickened.

3. Third Embodiment

Next, a semiconductor device of a third embodiment is described. In the third embodiment, a circuit including pMOS transistors and resistance elements is added to the high-frequency switch 20 in the first embodiment. In addition, a signal that is supplied to these pMOS transistors and resistance elements is prepared. In the third embodiment, the description of similar points to the configuration, operation and advantageous effects of the switch circuit 1 of the first embodiment is omitted, and different points are mainly described.

3.1 Configuration of the Third Embodiment

FIG. 8 is a circuit diagram illustrating a configuration of a switch circuit of the third embodiment.

A switch circuit 1 of the third embodiment is different from the configuration of the first embodiment with respect to an ON/OFF switch circuit 11b included in the switch control circuit 10, and a high-frequency switch 20d. Specifically, the differences are as follows.

The ON/OFF switch circuit 11b includes a terminal TRP connected to the drains of the pMOS transistor M7 and nMOS transistor M8. A signal RGP corresponding to the signal EP is output from the terminal TRP.

In addition to the configuration of the high-frequency switch 20 illustrated in FIG. 2, the high-frequency switch 20d includes, for example, pMOS transistors P1_1, P1_2, P1_3, ..., P1_(n−1), and P1_n, and resistance elements R2_1, R2_2, R2_3, ..., R2_(n−1), and R2_n.

In the high-frequency switch 20d, the pMOS transistor P1_1 that can short-circuit both ends of the resistance element R1_1 is provided. The pMOS transistor P1_2 that can short-circuit both ends of the resistance element R1_2 is provided. The pMOS transistor P1_3 that can short-circuit both ends of the resistance element R1_3 is provided. The subsequent pMOS transistors P1_4, P1_5, ..., P1_(n−1), and P1_n are similarly provided. Further, the gates of the pMOS transistors P1_1, P1_2, P1_3, ..., P1_(n−1), and P1_n are provided with the resistance elements R2_1, R2_2, R2_3, ..., R2_(n−1), and R2_n, respectively.

Hereinafter, the connections of the circuit elements in the high-frequency switch 20d are described.

The source and drain of the pMOS transistor P1_1 are connected between the gate of the nMOS transistor N1_1 and the gate of the nMOS transistor N1_2. In other words, the source of the pMOS transistor P1_1 is connected to the gate of the nMOS transistor N1_1, and the drain of the pMOS transistor P1_1 is connected to the gate of the nMOS transistor N1_2. The source and drain of the pMOS transistor P1_2 are connected between the gate of the nMOS transistor N1_2 and the gate of the nMOS transistor N1_3. In other words, the source of the pMOS transistor P1_2 is connected to the gate of the nMOS transistor N1_2, and the drain of the pMOS transistor P1_2 is connected to the gate of the nMOS transistor N1_3. The source and drain of the pMOS transistor P1_3 are connected between the gate of the nMOS transistor N1_3 and the gate of the nMOS transistor N1_4. In other words, the source of the pMOS transistor P1_3 is connected to the gate of the nMOS transistor N1_3, and the drain of the pMOS transistor P1_3 is connected to the gate of the nMOS transistor N1_4. Similar connections are established for the subsequent pMOS transistors P1_4, P1_5, ..., P1_(n−1). Further, the source of the pMOS transistor P1_n is connected to the gate of the nMOS transistor N1_n, and the terminal TSW is connected to the drain of the pMOS transistor P1_n.

The resistance element R2_1 is connected between the gate of the pMOS transistor P1_1 and the gate of the pMOS transistor P1_2. The resistance element R2_2 is connected between the gate of the pMOS transistor P1_2 and the gate of the pMOS transistor P1_3. The resistance element R2_3 is connected between the gate of the pMOS transistor P1_3 and the gate of the pMOS transistor P1_4. Similar connections are established for the subsequent resistance elements R2_4, R2_5, ..., R2_(n−1). Further, one end of the resistance element R2_n is connected to the gate of the pMOS transistor P1_n, and the terminal TRP is connected to the other end of the resistance element R2_n.

3.2 Operation of the Third Embodiment

In the case of switching the high-frequency switch 20d from the ON state to the OFF state, in the switch circuit 1 illustrated in FIG. 8, the signals SWG and RGP, which are output from the ON/OFF switch circuit 11b, are input to the terminals TSW and TRP of the high-frequency switch 20d.

In the high-frequency switch 20d, the nMOS transistors N1_n, N1_(n−1), N1_(n−2), ..., N1_1 are successively turned off by the signal SWG that is input to the terminal TSW. In addition, the pMOS transistors P1_n, P1_(n−1), P1_(n−2), ..., P1_1 are successively turned off by the signal RGP that is input to the terminal TRP. Thereby, the ON-to-OFF transition of the nMOS transistors N1_n, N1_(n−1), N1_(n−2), ..., N1_1 is quickened. As a result, the switching of the high-frequency switch 20d from the ON state to the OFF state is quickened.

3.3 Advantageous Effects of the Third Embodiment

According to the third embodiment, a semiconductor device capable of quickening ON/OFF switching of a high-frequency switch can be provided.

Furthermore, in addition to the configuration of the first embodiment, the third embodiment includes the pMOS transistors P1_1 to P1_n for electrically shutting off both ends of each of the resistance elements R1_1 to R1_n in the high-frequency switch 20d, and the signal RGP for controlling the ON and OFF of the pMOS transistors P1_1 to P1_n. Thereby, the time needed until all pMOS transistors P1_1 to P1_n in the high-frequency switch 20d are turned off can be shortened. As a result, the switching of the high-frequency switch 20d from the ON state to the OFF state can be quickened.

4. Fourth Embodiment

Next, a semiconductor device of a fourth embodiment is described. In the fourth embodiment, a circuit including nMOS transistors and resistance elements, and a circuit including pMOS transistors and resistance elements, are added to the high-frequency switch 20 in the first embodiment. In addition, a signal that is supplied to the circuit including the nMOS transistors and resistance elements, and a signal that is supplied to the circuit including the pMOS transistors and resistance elements, are prepared. In the fourth embodiment, the description of similar points to the configuration, operation and advantageous effects of the switch circuit 1 of the first embodiment is omitted, and different points are mainly described.

4.1 Configuration of the Fourth Embodiment

FIG. 9 is a circuit diagram illustrating a configuration of a switch circuit of the fourth embodiment.

A switch circuit 1 of the fourth embodiment is different from the configuration of the first embodiment with respect to an ON/OFF switch circuit 11c included in the switch control circuit 10, and a high-frequency switch 20e. Specifically, the differences are as follows.

The ON/OFF switch circuit 11c includes a terminal TRN connected to the drains of the pMOS transistor M15 and nMOS transistor M16. A signal RGN corresponding to the signal EN is output from the terminal TRN. The ON/OFF switch circuit 11c also includes a terminal TRP connected to the drains of the pMOS transistor M7 and nMOS transistor M8. A signal RGP corresponding to the signal EP is output from the terminal TRP.

In addition to the configuration of the high-frequency switch 20 illustrated in FIG. 2, the high-frequency switch 20e includes, for example, nMOS transistors N2_1, N2_2, N2_3, . . . , N2_(n-1), and N2_n, and resistance elements R2_1, R2_2, R2_3, . . . , R2_(n-1), and R2_n.

The drain and source of the nMOS transistor N2_1 are connected between the gate of the nMOS transistor N1_1 and the gate of the nMOS transistor N1_2. In other words, the drain of the nMOS transistor N2_1 is connected to the gate of the nMOS transistor N1_1, and the source of the nMOS transistor N2_1 is connected to the gate of the nMOS transistor N1_2. The drain and source of the nMOS transistor N2_2 are connected between the gate of the nMOS transistor N1_2 and the gate of the nMOS transistor N1_3. In other words, the drain of the nMOS transistor N2_2 is connected to the gate of the nMOS transistor N1_2, and the source of the nMOS transistor N2_2 is connected to the gate of the nMOS transistor N1_3. The drain and source of the nMOS transistor N2_3 are connected between the gate of the nMOS transistor N1_3 and the gate of the nMOS transistor N1_4. In other words, the drain of the nMOS transistor N2_3 is connected to the gate of the nMOS transistor N1_3, and the source of the nMOS transistor N2_3 is connected to the gate of the nMOS transistor N1_4. Similar connections are established for the subsequent nMOS transistors N2_4, N2_5, . . . , N2_(n-1). Further, the drain of the nMOS transistor N2_n is connected to the gate of the nMOS transistor N1_n, and the terminal TSW is connected to the source of the nMOS transistor N2_n.

The resistance element R2_1 is connected between the gate of the nMOS transistor N2_1 and the gate of the nMOS transistor N2_2. The resistance element R2_2 is connected between the gate of the nMOS transistor N2_2 and the gate of the nMOS transistor N2_3. The resistance element R2_3 is connected between the gate of the nMOS transistor N2_3 and the gate of the nMOS transistor N2_4. Similar connections are established for the subsequent resistance elements R2_4, R2_5, . . . , R2_(n-1). Further, one end of the resistance element R2_n is connected to the gate of the nMOS transistor N2_n, and the terminal TRN is connected to the other end of the resistance element R2_n.

The high-frequency switch 20e further includes, for example, pMOS transistors P1_1, P1_2, P1_3, . . . , P1_(n-1), and P1_n, and resistance elements R3_1, R3_2, R3_3, . . . , R3_(n-1), and R3_n.

The source and drain of the pMOS transistor P1_1 are connected between the gate of the nMOS transistor N1_1 and the gate of the nMOS transistor N1_2. In other words, the source of the pMOS transistor P1_1 is connected to the gate of the nMOS transistor N1_1, and the drain of the pMOS transistor P1_1 is connected to the gate of the nMOS transistor N1_2. The source and drain of the pMOS transistor P1_2 are connected between the gate of the nMOS transistor N1_2 and the gate of the nMOS transistor N1_3. In other words, the source of the pMOS transistor P1_2 is connected to the gate of the nMOS transistor N1_2, and the drain of the pMOS transistor P1_2 is connected to the gate of the nMOS transistor N1_3. The source and drain of the pMOS transistor P1_3 are connected between the gate of the nMOS transistor N1_3 and the gate of the nMOS transistor N1_4. In other words, the source of the pMOS transistor P1_3 is connected to the gate of the nMOS transistor N1_3, and the drain of the pMOS transistor P1_3 is connected to the gate of the nMOS transistor N1_4. Similar connections are established for the subsequent pMOS transistors P1_4, P1_5, . . . , P1_(n-1). Further, the source of the pMOS transistor P1_n is connected to the gate of the nMOS transistor N1_n, and the terminal TSW is connected to the drain of the pMOS transistor P1_n.

The resistance element R3_1 is connected between the gate of the pMOS transistor P1_1 and the gate of the pMOS transistor P1_2. The resistance element R3_2 is connected between the gate of the pMOS transistor P1_2 and the gate of the pMOS transistor P1_3. The resistance element R3_3 is connected between the gate of the pMOS transistor P1_3 and the gate of the pMOS transistor P1_4. Similar connections are established for the subsequent resistance elements R3_4, R3_5, . . . , R3_(n-1). Further, one end of the resistance element R3_n is connected to the gate of the pMOS transistor P1_n, and the terminal TRP is connected to the other end of the resistance element R3_n.

4.2 Operation of the Fourth Embodiment

In the case of switching the high-frequency switch 20e from the OFF state to the ON state, in the switch circuit 1 illustrated in FIG. 9, the signals SWG and RGN, which are output from the ON/OFF switch circuit 11c are input to the terminals TSW and TRN of the high-frequency switch 20e, respectively.

In the high-frequency switch 20e, the nMOS transistors N1_n, N1_(n−1), N1_(n−2), . . . , N1_1 are successively turned on by the signal SWG that is input to the terminal TSW. In addition, the nMOS transistors N2_n, N2_(n−1), N2_(n−2), . . . , N2_1 are successively turned on by the signal RGN that is input to the terminal TRN. Thereby, the resistance elements R1_n, R1_(n−1), R1_(n−2), . . . , R1_1 are short-circuited by the nMOS transistors N2_n, N2_(n−1), N2_(n−2), . . . , N2_1, and the OFF-to-ON transition of the nMOS transistors N1_n, N1_(n−1), N1_(n−2), . . . , N1_1 is quickened. As a result, the switching of the high-frequency switch 20e from the OFF state to the ON state is quickened.

On the other hand, in the case of switching the high-frequency switch 20e from the ON state to the OFF state, in the switch circuit 1 illustrated in FIG. 9, the signals SWG and RGP, which are output from the ON/OFF switch circuit 11c, are input to the terminals TSW and TRP of the high-frequency switch 20e.

In the high-frequency switch 20e, the nMOS transistors N1_n, N1_(n−1), N1_(n−2), . . . , N1_1 are successively turned off by the signal SWG that is input to the terminal TSW. In addition, the pMOS transistors P1_n, P1_(n−1), P1_(n−2), . . . , P1_1 are successively turned off by the signal RGP that is input to the terminal TRP. Thereby, the ON-to-OFF transition of the nMOS transistors N1_n, N1_(n−1), N1_(n−2), . . . , N1_1 is quickened. As a result, the switching of the high-frequency switch 20e from the ON state to the OFF state is quickened.

4.3 Advantageous Effects of the Fourth Embodiment

According to the fourth embodiment, a semiconductor device capable of quickening ON/OFF switching of a high-frequency switch can be provided.

Furthermore, in addition to the configuration of the first embodiment, the fourth embodiment includes the nMOS transistors N2_1 to N2_n for short-circuiting both ends of each of the resistance elements R1_1 to R1_n in the high-frequency switch 20e, and the signal RGN for controlling the ON and OFF of the nMOS transistors N2_1 to N2_n. Thereby, the time needed until all nMOS transistors N1_1 to N1_n in the high-frequency switch 20e are turned on can be shortened. As a result, the switching of the high-frequency switch 20e from the OFF state to the ON state can be quickened.

Moreover, in addition to the configuration of the first embodiment, the fourth embodiment includes the pMOS transistors P1_1 to P1_n for electrically shutting off both ends of each of the resistance elements R1_1 to R1_n in the high-frequency switch 20e, and the signal RGP for controlling the ON and OFF of the pMOS transistors P1_1 to P1_n. Thereby, the time needed until all pMOS transistors P1_1 to P1_n in the high-frequency switch 20e are turned off can be shortened. As a result, the switching of the high-frequency switch 20e from the ON state to the OFF state can be quickened.

5. Fifth Embodiment

Next, a semiconductor device of a fifth embodiment is described. For example, in the wireless device WD illustrated in FIG. 1, in the case of controlling the four switch circuits 1, 2, 3 and 4 by the control signals CNT1, CNT2, CNT3 and CNT4, four delay circuits 12 are required. However, since the delay circuit 12 includes the resistance element R and the capacitance element C, there may be a case where an occupied area by the delay circuit becomes large. Thus, by using delay circuit proposed in the fifth embodiment, the number of RC circuits is reduced to one, thereby reducing the occupied area by the delay circuit. In the fifth embodiment, the description of similar points to the configuration, operation and advantageous effects of the switch circuit 1 of the first embodiment is omitted, and different points are mainly described.

5.1 Configuration of the Fifth Embodiment

FIG. 10 is a circuit diagram illustrating a configuration of a delay circuit included in a plurality of switch circuits of the fifth embodiment.

A plurality of switch circuits of the fifth embodiment are different from the configuration of the first embodiment with respect to a delay circuit 12a included in a plurality of switch control circuits 10. Specifically, the differences are as follows.

The delay circuit 12a includes a plurality of buffers B11, B12, B13 and B14, exclusive OR circuits XO1, XO2, XO3, XO4 and XO5, D flip-flops DF1, DF2, DF3, DF4 and DF5, AND circuits AD1, AD2, AD3 and AD4, OR circuits OR1, OR2, OR3, OR4 and OR5, inverters IV1, IV2 and IV3, a resistance element R, and a capacitance element C.

Hereinafter, the connections of circuit elements in the delay circuit 12a are described.

The control signals CNT1, CNT2, CNT3 and CNT4 are input to first input terminals of the exclusive OR circuits XO1, XO2, XO3 and XO4. The control signals CNT1, CNT2, CNT3 and CNT4 are also input to D input terminals of the D flip-flops DF1, DF2, DF3 and DF4. Further, the control signals CNT1, CNT2, CNT3 and CNT4 are also input to first input terminals of the AND circuits AD1, AD2, AD3 and AD4, and to first input terminals of the OR circuits OR1, OR2, OR3 and OR4.

The control signals CNT1, CNT2, CNT3 and CNT4 are input to input terminals of the buffers B11, B12, B13 and B14. Output terminals of the buffers B11, B12, B13 and B14 are connected to second input terminals of the exclusive OR circuits XO1, XO2, XO3 and XO4.

Output terminals of the exclusive OR circuits XO1, XO2, XO3 and XO4 are connected to four input terminals of the OR circuit OR5, respectively. An output terminal of the OR circuit OR5 is connected to a clock input terminal of the D flip-flop DF5. A Q inversion output terminal of the D flip-flop DF5 is connected to a D input terminal.

A Q output terminal of the D flip-flop DF5 is connected to a first input terminal of the exclusive OR circuit XO5 via the inverter IV1, resistance element R and inverter IV2. A first electrode of the capacitance element C is connected to a node between the resistance element R and the inverter IV2, and a second electrode of the capacitance element C is connected to a ground voltage GND node. The Q output terminal of the D flip-flop DF5 is also connected to a second input terminal of the exclusive OR circuit XO5.

An output terminal of the exclusive OR circuit XO5 is connected, via the inverter IV3, to clock input terminals of the D flip-flops DF1, DF2, DF3 and DF4. Q output terminals of the D flip-flops DF1, DF2, DF3 and DF4 are connected to second input terminals of the AND circuits AD1, AD2, AD3 and AD4, and to second input terminals of the OR circuits OR1, OR2, OR3 and OR4.

In addition, signals EP1 and EN1 are output from output terminals of the AND circuit AD1 and OR circuit OR1, respectively. Signals EP2 and EN2 are output from output terminals of the AND circuit AD2 and OR circuit OR2, respectively. Signals EP3 and EN3 are output from output terminals of the AND circuit AD3 and OR circuit OR3, respectively. Further, signals EP4 and EN4 are output from output terminals of the AND circuit AD4 and OR circuit OR4, respectively.

5.2 Operation of the Fifth Embodiment

Referring to FIG. 10, an operation of the delay circuit 12a in the fifth embodiment is described.

The control signals CNT1, CNT2, CNT3 and CNT4 that control the switch circuities 1, 2, 3 and 4 are input to the delay circuit 12a. For example, as the control signals CNT1 to CNT4, signal waveforms as indicated by (1a), (2a), (3a) and (4a) in FIG. 10 are input to the buffers B11, B12, B13 and B14. Then, as the signals EP1 and EN1, EP2 and EN2, EP3 and EN3, and EP4 and EN4, signal waveforms as indicated by (1b), (2b), (3b) and (4b) are output from the circuits AD1 and OR1, AD2 and OR2, AD3 and OR3, and AD4 and OR4, via logical circuits provided in output stages of the buffers B11 to B14, and one RC circuit.

Thereafter, the signals EP and EN1, EP2 and EN2, EP3 and EN3, and EP4 and EN4, which are output from the delay circuit 12a, are input to the ON/OFF switch circuits 11 in the switch circuits 1, 2, 3 and 4, and signals SWG are generated.

Although the example in which each of the buffers B11 to B14 includes a three-stage buffer was illustrated here, each of the buffers B11 to B14 may be a one-stage buffer or a two-stage buffer, or a buffer of four or more stages, if a signal delay necessary for the rear-stage circuit operation can be generated. Moreover, although the delay circuit that generates a signal delay by using the RC circuit including the resistance element R and capacitance element C is illustrated here, a delay circuit may be constituted by a plurality of stages of buffers alone, without using the RC circuit, if a delay necessary for the signals EP1 to EP4 and the signals EN1 to EN4 can be generated by a plurality of stages of buffers alone. The same applies to delay circuits to be described later.

5. Advantageous Effects of the Fifth Embodiment

According to the fifth embodiment, a semiconductor device capable of quickening ON/OFF switching of a high-frequency switch can be provided.

Furthermore, in the fifth embodiment, a plurality of delay circuities for controlling a plurality of switch circuits are constituted by one RC circuit. Thereby, an increase in occupied area, which occurs in the case of providing a plurality of delay circuities, can be prevented, and the occupied area by the delay circuits can be reduced. Although the example in which four delay circuities are constituted by one RC circuit is illustrated here, the embodiment is not limited to this. Delay circuities, the number of which is other than four, can be constituted by one RC delay circuit.

6. Sixth Embodiment

Next, a semiconductor device of a sixth embodiment is described. There is a case where there are a plurality of switch circuities to which the power supply circuit (for example, charge pump) 8 supplies voltages Vp and Vn, and a plurality of switch circuities are switched at the same time.

There is a case where as the number of switch circuities, which are turned on or off at the same time, is larger, the variations of the voltages Vp and Vn become larger and the ON/OFF switching time becomes longer. In the sixth embodiment, the delay time in the delay circuit is optimized in accordance with the number of switch circuities to be switched, and the switching is quickened with respect to the number of switch circuities to be switched.

6.1 Configuration of the Sixth Embodiment

FIG. 11 is a circuit diagram illustrating a configuration of a delay circuit included in a plurality of switch circuits of the sixth embodiment.

A plurality of switch circuits of the sixth embodiment are different from the configuration of the first embodiment with respect to a delay circuit 12b included in a plurality of switch control circuits 10. Specifically, the differences are as follows.

The delay circuit 12b includes a plurality of buffers B11, B12, B13, B14, B15 and B16, exclusive OR circuits XO1, XO2, XO3, XO4 and XO5, D flip-flops DF1, DF2, DF3, DF4, DF5, DF6, DF7, DF8 and DF9, AND circuits AD1, AD2, AD3 and AD4, OR circuits OR1, OR2, OR3, OR4 and OR5, inverters IV1, IV2 and IV3, a variable resistance element VR, a capacitance element C, and a count circuit CO.

Hereinafter, the connections of circuit elements in the delay circuit 12b are described.

The control signals CNT1, CNT2, CNT3 and CNT4 are input to first input terminals of the exclusive OR circuits XO1, XO2, XO3 and XO4. The control signals CNT1, CNT2, CNT3 and CNT4 are also input to D input terminals of the D flip-flops DF1, DF2, DF3 and DF4. Further, the control signals CNT1, CNT2, CNT3 and CNT4 are also input to first input terminals of the AND circuits AD1, AD2, AD3 and AD4, and to first input terminals of the OR circuits OR1, OR2, OR3 and OR4.

The control signals CNT1, CNT2, CNT3 and CNT4 are input to input terminals of the buffers B11, B12, B13 and B14. Output terminals of the buffers B11, B12, B13 and B14 are connected to second input terminals of the exclusive OR circuits XO1, XO2, XO3 and XO4.

Output terminals of the exclusive OR circuits XO1, XO2, XO3 and XO4 are connected to four input terminals of the OR circuit OR5, respectively. The output terminals of the exclusive OR circuits XO1, XO2, XO3 and XO4 are also connected to input terminals of the D flip-flops DF5, DF6, DF7 and DF8. Q output terminals of the D flip-flops DF5, DF6, DF7 and DF8 are connected to input terminals of the count circuit CO, respectively. An output terminal of the count circuit CO is input to a control end of the variable resistance element VR. The count circuit CO counts the number of risings and the number of fallings of the signals CNT1, CNT2, CNT3 and CNT4 by using signals that are output from the Q output terminals of the D flip-flops DF5 to DF8, and outputs a signal corresponding to the counted numbers to the control end. In accordance with the signal input to the control end, the variable resistance element VR varies the resistance value. Note that the number of risings and the number of fallings correspond to the number of high-frequency switches that are to be switched.

An output terminal of the OR circuit OR5 is connected to a clock input terminal of the D flip-flop DF9 via the buffers B15 and B16. A Q inversion output terminal of the D flip-flop DF5 is connected to a D input terminal. A node between the buffers B15 and B16 is connected to clock input terminals of the D flip-flops DF5, DF6, DF7 and DF8.

A Q output terminal of the D flip-flop DF9 is connected to a first input terminal of the exclusive OR circuit XO5 via the inverter IV1, variable resistance element VR and inverter IV2. A first electrode of the capacitance element C is connected to a node between the variable resistance element VR and the inverter IV2, and a second electrode of the capacitance element C is connected to a ground voltage GND node. The Q output terminal of the D flip-flop DF9 is also connected to a second input terminal of the exclusive OR circuit XO5.

An output terminal of the exclusive OR circuit XO5 is connected, via the inverter IV3, to clock input terminals of the D flip-flops DF1, DF2, DF3 and DF4. Q output terminals of the D flip-flops DF1, DF2, DF3 and DF4 are connected to second input terminals of the AND circuits AD1, AD2, AD3 and AD4, and to second input terminals of the OR circuits OR1, OR2, OR3 and OR4.

In addition, signals EP1 and EN1 are output from output terminals of the AND circuit AD1 and OR circuit OR1, respectively. Signals EP2 and EN2 are output from output terminals of the AND circuit AD2 and OR circuit OR2, respectively. Signals EP3 and EN3 are output from output terminals of the AND circuit AD3 and OR circuit OR3, respectively. Further, signals EP4 and EN4 are output from output terminals of the AND circuit AD4 and OR circuit OR4, respectively.

6.2 Operation of the Sixth Embodiment

Referring to FIG. 11 and FIG. 12, an operation of the delay circuit 12b in the sixth embodiment is described. FIG. 12 is a timing chart illustrating an operation of the switch control circuits 10 in the switch circuit of the sixth embodiment.

The control signals CNT1, CNT2, CNT3 and CNT4 that control the switch circuities 1, 2, 3 and 4 are input to the delay circuit 12b. For example, as the control signals CNT1 to CNT4, signal waveforms as indicated by (1c), (2c), (3c) and (4c) in FIG. 11 are input to the buffers B11, B12, B13 and B14. Then, as the signals EP1 and EN1, EP2 and EN2, EP3 and EN3, and EP4 and EN4, signal waveforms as indicated by (1d), (2d), (3d) and (4d) are output from the circuits AD1 and OR1, AD2 and OR2, AD3 and OR3, and AD4 and OR4, via logical circuits provided in output stages of the buffers B11 to B14, the count circuit CO, and the RC circuit including the variable resistance element VR.

Thereafter, the signals EP1 and EN1, EP2 and EN2, EP3 and EN3, and EP4 and EN4, which are output from the delay circuit 12b, are input to the ON/OFF switch circuits 11 in the switch circuits 1, 2, 3 and 4, and signals SWG are generated.

Here, as illustrated in FIG. 12, for example, if the control signal CNT1 rises from "L" to "H" at time t1, the signal EN1 rises from "L" to "H" at the same time t1. Thereafter, at time t2b, the signal EP1 rises from "L" to "H". In addition, for example, at time t1, the control signal CNT2 is kept at "L", CNT3 falls from "H" to "L", and CNT4 is kept at "H". This period of time t1 to t2b (i.e., a transition period from the OFF state to ON state) varies in accordance with a number that is the total of the number of risings and the number of fallings of the signals CNT1, CNT2, CNT3 and CNT4. The total number of risings and fallings corresponds to the number of high-frequency switches to be switched. The number of risings is also referred to as a transition number from "L" to "H", and the number of fallings is also referred to as a transition number from "H" to "L".

Here, although the period of time t1 to t2b (i.e., the transition period from the OFF state to ON state) is varied in accordance with the total number of the number of risings and the number of fallings, the transition period from the OFF state to ON state may be varied in accordance with the number of risings, and the transition period from the ON state to OFF state may be varied in accordance with the number of fallings.

In the delay circuit 12b, if the number of risings and fallings is larger, that is, if the number of high-frequency switches to be switched is larger, the resistance value of the variable resistance element VR increases and the period of time t1 to t2b is set to be longer. In addition, if the number of risings and fallings is smaller, that is, if the number of high-frequency switches to be switched is smaller, the resistance value of the variable resistance element VR decreases and the period of time t1 to t2b is set to be shorter. Thereby, the switching time of the high-frequency switch can be set to a proper time, that is, to a shortest time.

6.3 Advantageous Effects of the Sixth Embodiment

According to the sixth embodiment, a semiconductor device capable of quickening ON/OFF switching of a high-frequency switch can be provided.

Furthermore, in the sixth embodiment, in the case of controlling a plurality of switch circuits, the delay time in the delay circuit can be set to a shortest time in accordance with the number of ON/OFF switchings of the high-frequency switches in the switch circuits. Thereby, the ON/OFF switching of the high-frequency switches in the switch circuits can be quickened.

6.4 Modification of the Sixth Embodiment

Figure 13:
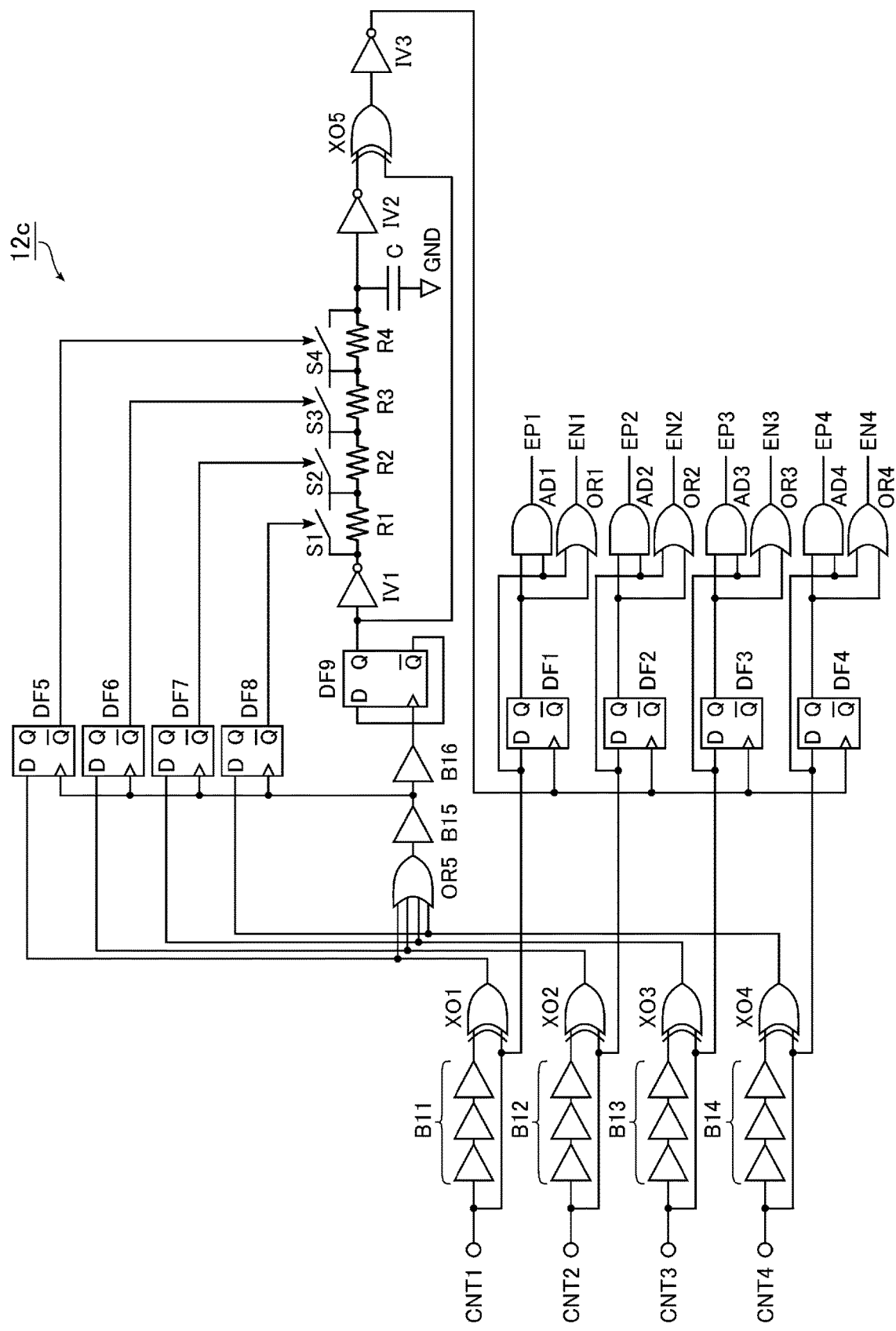
FIG. 13 is a circuit diagram illustrating a configuration of a delay circuit included in a switch circuit of a modification of the sixth embodiment.

Next, a switch circuit of a modification of the sixth embodiment is described. FIG. 13 is a circuit diagram illustrating a configuration of a delay circuit included in the switch circuit of the modification of the sixth embodiment.

A plurality of switch circuits of the modification are different from the configuration of the sixth embodiment with respect to a delay circuit 12c included in a plurality of switch control circuits 10. Specifically, the differences are as follows.

The delay circuit 12c includes a plurality of buffers B11, B12, B13, B14, B15 and B16, exclusive OR circuits XO1, XO2, XO3, XO4 and XO5, D flip-flops DF1, DF2, DF3, DF4, DF5, DF6, DF7, DF8 and DF9, AND circuits AD1, AD2, AD3 and AD4, OR circuits OR1, OR2, OR3, OR4 and OR5, inverters IV1, IV2 and IV3, resistance elements R1, R2, R3 and R4, switch elements S1, S2, S3 and S4, and a capacitance element C.

Hereinafter, the connections of circuit elements in the delay circuit 12c are described.

Q inversion output terminals of the D flip-flops DF5, DF6, DF7 and DF8 are connected to control ends of the switch elements S1, S2, S3 and S4.

An output end of the inverter IV1 is connected to an input end of the inverter IV2 via the four resistance elements R1, R2, R3 and R4 that are connected in series. One end of the switch element S1 is connected to one end of the resistance element R1, and the other end of the switch element S1 is connected to the other end of the resistance element R1. One end of the switch element S2 is connected to one end of the resistance element R2, and the other end of the switch element S2 is connected to the other end of the resistance element R2. One end of the switch element S3 is connected to one end of the resistance element R3, and the other end of the switch element S3 is connected to the other end of the resistance element R3. One end of the switch element S4 is connected to one end of the resistance element R4, and the other end of the switch element S4 is connected to the other end of the resistance element R4.

A first electrode of the capacitance element C is connected to a node between the resistance element R4 and the inverter IV2, and a second electrode of the capacitance element C is connected to a ground voltage GND node. The other connections are the same as in the sixth embodiment.

Figure 14:
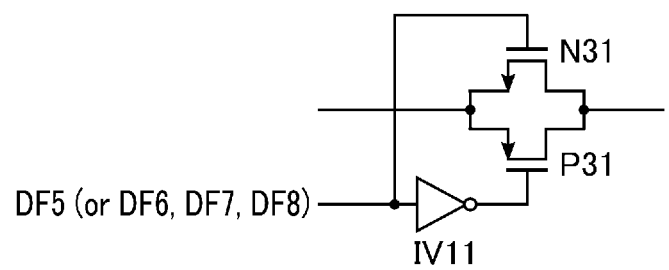
FIG. 14 is a circuit diagram illustrating a configuration of a switch element in a delay circuit of a modification of the sixth embodiment.

FIG. 14 illustrates a detailed circuit diagram of each of the switch elements S1, S2, S3 and S4. Each of the switch elements S1, S2, S3 and S4 includes an nMOS transistor N31, a pMOS transistor P31, and an inverter IV11. A signal, which is output from the Q inversion output terminal of each of the D flip-flops DF5, DF6, DF7 and DF8, is input to the gate of the nMOS transistor N31 and an input terminal of the inverter IV11 of each of the switch elements S1, S2, S3 and S4. An output terminal of the inverter IV11 is connected to the gate of the pMOS transistor P31. Each of the switch elements S1, S2, S3 and S4 sets the switch element in a connected state or a disconnected state in accordance with a signal that is input to the control end, i.e., the gate of the nMOS transistor N31, and the inverter IV11.

In the delay circuit 12c, the period of time t1 to t2b illustrated in FIG. 12 varies in accordance with the number of risings and fallings of the signals CNT1, CNT2, CNT3 and CNT4.

If the number of risings and fallings of the signals CNT1, CNT2, CNT3 and CNT4 is larger, that is, if the number of high-frequency switches to be switched is larger, the number of switch elements set in the disconnected state, among the switch elements S1 to S4, becomes larger. Thus, the resistance value of the circuit including the switch elements S1 to S4 and the resistance elements R1 to R4 becomes greater. Thereby, the period of time t1 to t2b is set to be longer.

On the other hand, if the number of risings and fallings of the signals CNT1, CNT2, CNT3 and CNT4 is smaller, that is, if the number of high-frequency switches to be switched is smaller, the number of switch elements set in the connected state, among the switch elements S1 to S4, becomes larger. Thus, the resistance value of the circuit including the switch elements S1 to S4 and the resistance elements R1 to R4 becomes smaller. Thereby, the period of time t1 to t2b is set to be shorter. By these controls, the switching time of the high-frequency switch can be set to a proper time, that is, to a shortest time.

7. Seventh Embodiment

Next, a semiconductor device of a seventh embodiment is described. In the seventh embodiment, the pMOS transistor M4 and the diode D2 in the switch control circuit 10 of the first embodiment are omitted. In the seventh embodiment, the description of similar points to the configuration, operation and advantageous effects of the switch circuit 1 of the first embodiment is omitted, and different points are mainly described.

7.1 Configuration of the Seventh Embodiment

Figure 15:
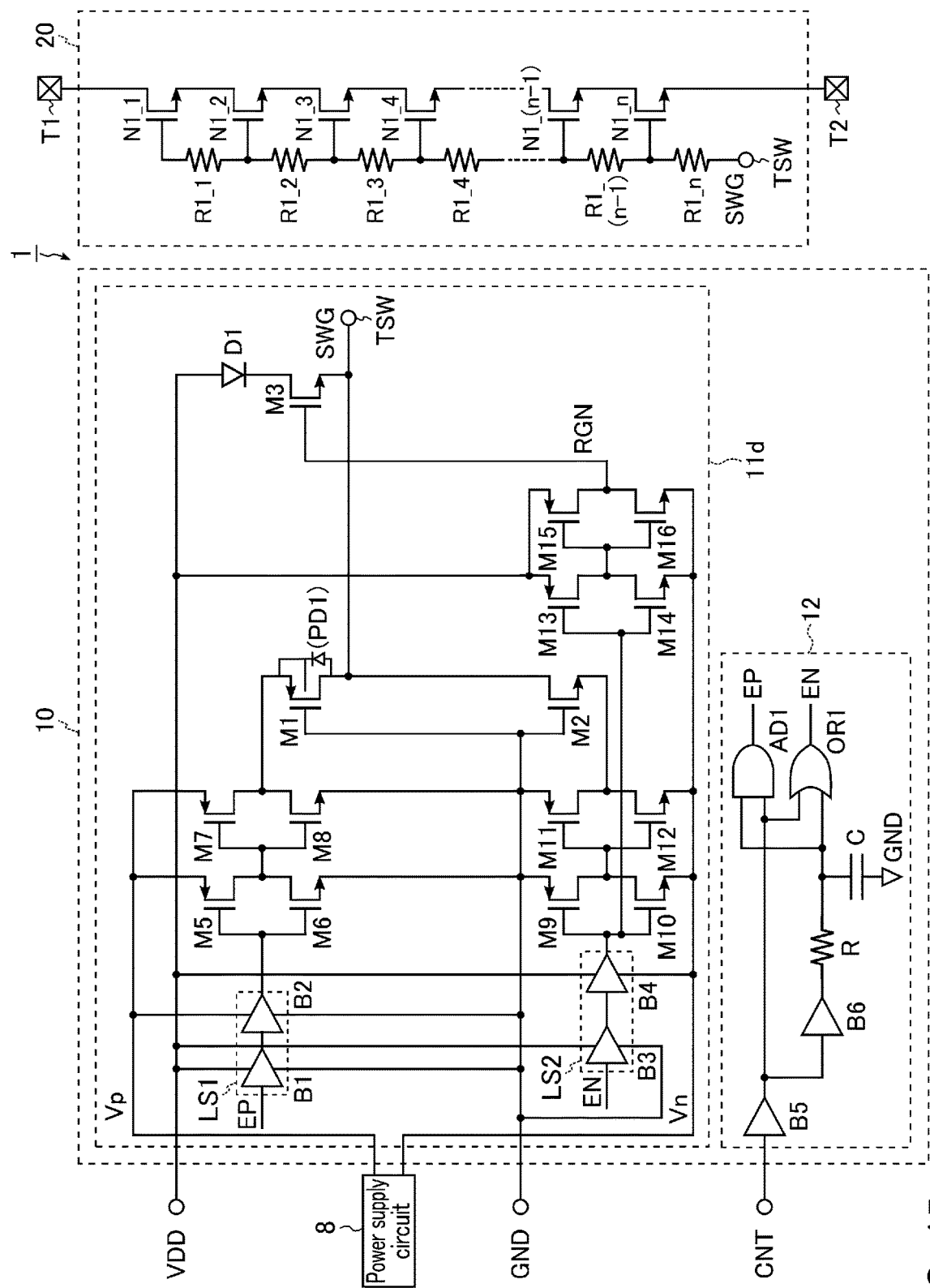
FIG. 15 is a circuit diagram illustrating a configuration of a switch circuit of a seventh embodiment.

FIG. 15 is a circuit diagram illustrating a configuration of a switch circuit of the seventh embodiment.

A switch circuit 1 of the seventh embodiment is different from the configuration of the first embodiment with respect to an ON/OFF switch circuit 11d included in the switch control circuit 10. Specifically, the differences are as follows.

In the ON/OFF switch circuit 11d, the pMOS transistor M4 and the diode D2 in the configuration of the ON/OFF switch circuit 11 illustrated in FIG. 2 are omitted.

7.2 Operation of the Seventh Embodiment

FIG. 16 is a circuit diagram illustrating a part of an operation of the ON/OFF switch circuit 11d in the switch circuit of the seventh embodiment.

In the seventh embodiment, in a case of switching the high-frequency switch 20 from the ON state to OFF state, or from the OFF state to ON state, signals EP and EN similar to those illustrated in FIG. 3 are supplied.

In the ON/OFF switch circuit 11 of the first embodiment illustrated in FIG. 2, at a time of switching the high-frequency switch 20 from the ON state to OFF state, the charge of the voltage Vp (for example, 3.5 V) of the signal SWG flows, as illustrated in part (b) of FIG. 16, to the ground voltage GND node (for example, 0 V) through the pMOS transistor M4 and the diode D2.

In the ON/OFF switch circuit 11d of the seventh embodiment, at a time of switching the high-frequency switch 20 from the ON state to OFF state, the charge of the voltage Vp (for example, 3.5 V) of the signal SWG flows, during the period of time t3 to t4, as illustrated in part (a) of FIG. 16, to a node to which the source of the pMOS transistor M1 is connected, through a parasitic diode PD1 existing in the pMOS transistor M1. At this time, a node to which the source of the pMOS transistor M1 is connected is set at the ground voltage GND (for example, 0 V). Thereby, the signal SWG falls from the voltage Vp to the ground voltage GND. Note that the period of time t3 to t4 is a period in which the signal EP is "L" and the signal EN is "H".

In addition, the operation in the case of switching the high-frequency switch 20 from the OFF state to ON state is similar to the operation in the first embodiment.

7.3 Advantageous Effects of the Seventh Embodiment

According to the seventh embodiment, a semiconductor device capable of quickening ON/OFF switching of a high-frequency switch can be provided.

Furthermore, in the seventh embodiment, in the case of switching the high-frequency switch 20 from the ON state to OFF state, that is, in the case of switching the signal SWG from the voltage Vp to the voltage Vn, the period in which the signal EP is "L" and the signal EN is "H" (the period of time t3 to t4) is set, and thereby the charge of the voltage Vp in the signal SWG in this period can be discharged to the ground voltage GND via the parasitic diode PD1 existing in the pMOS transistor M1.

Therefore, in the configuration of the first embodiment illustrated in FIG. 2, the pMOS transistor M4 and the diode D2 can be omitted, and the configuration of the seventh embodiment can be implemented.

8. Eighth Embodiment

Next, a semiconductor device of an eighth embodiment is described. In the eighth embodiment, the nMOS transistor M3, diode D1, pMOS transistor M4, and diode D2 in the switch control circuit 10 of the first embodiment are omitted. In the eighth embodiment, the description of similar points to the configuration, operation and advantageous effects of the switch circuit 1 of the first embodiment is omitted, and different points are mainly described.

8.1 Configuration of the Eighth Embodiment

FIG. 17 is a circuit diagram illustrating a configuration of a switch circuit of the eighth embodiment.

A switch circuit 1 of the eighth embodiment is different from the configuration of the first embodiment with respect to an ON/OFF switch circuit 11e included in the switch control circuit 10. Specifically, the differences are as follows.

In the ON/OFF switch circuit 11e, the nMOS transistor M3, diode D1, pMOS transistor M4, diode D2, pMOS transistor M13, nMOS transistor M14, pMOS transistor M15 and nMOS transistor M16 in the configuration of the ON/OFF switch circuit 11 illustrated in FIG. 2 are omitted.

8.2 Operation of the Eighth Embodiment

FIG. 18 is a circuit diagram illustrating a part of an operation of the ON/OFF switch circuit 11e in the switch circuit of the eighth embodiment.

In the eighth embodiment, in a case of switching the high-frequency switch 20 from the ON state to OFF state, or from the OFF state to ON state, signals EP and EN similar to those illustrated in FIG. 3 are supplied.

In the ON/OFF switch circuit 11 of the first embodiment illustrated in FIG. 2, at a time of switching the high-frequency switch 20 from the OFF state to ON state, as illustrated in part (b) of FIG. 18, the signal SWG rises from the voltage Vn (for example, −3.5 V) to the power supply voltage VDD (for example, 1.2 V) by the current flowing from the power supply voltage VDD node to the terminal TSW through the diode D1 and nMOS transistor M3.

In the ON/OFF switch circuit 11e of the eighth embodiment, at a time of switching the high-frequency switch 20 from the OFF state to ON state, as illustrated in part (a) of FIG. 18, in the period of time t1 to t2, current flows from the node, to which the source of the nMOS transistor M2 is connected, to the terminal TSW through a parasitic diode PD2 existing in the nMOS transistor M2. At this time, the node, to which the source of the nMOS transistor M2 is connected, is set at the ground voltage GND. Thereby, the signal SWG rises from the voltage Vn (for example, −3.5 V) to the ground voltage GND (for example, 0 V). Note that the period of time t1 to t2 is a period in which the signal EP is "L" and the signal EN is "H".

In addition, the operation in the case of switching the high-frequency switch 20 from the ON state to OFF state is similar to the operation in the seventh embodiment.

8.3 Advantageous Effects of the Eighth Embodiment

According to the eighth embodiment, a semiconductor device capable of quickening ON/OFF switching of a high-frequency switch can be provided.

Furthermore, in the eighth embodiment, in the case of switching the high-frequency switch 20 from the OFF state to ON state, that is, in the case of switching the signal SWG from the voltage Vn to the voltage Vp, the period in which the signal EP is "L" and the signal EN is "H" (the period of time t1 to t2) is set, and thereby, during this period, current is caused to flow from the node, to which the source of the nMOS transistor M2 is connected, to the terminal TSW through the parasitic diode PD2 existing in the nMOS transistor M2. Thereby, the signal SWG can be raised from the voltage Vn to the ground voltage GND.

In addition, like the seventh embodiment, in the case of switching the high-frequency switch 20 from the ON state to OFF state, the period in which the signal EP is "L" and the signal EN is "H" (the period of time t3 to t4) is set, and thereby the charge of the voltage Vp in the signal SWG can be discharged to the ground voltage GND via the parasitic diode PD1 existing in the pMOS transistor M1.

By the above, in the configuration of the first embodiment illustrated in FIG. 2, the nMOS transistor M3, diode D1, pMOS transistor M4, diode D2, pMOS transistor M13, nMOS transistor M14, pMOS transistor M15 and nMOS transistor M16 can be omitted, and the configuration of the eighth embodiment can be implemented.

9. Ninth Embodiment

Next, a semiconductor device of a ninth embodiment is described. In the second embodiment, the signal RGN that is input to the gate of the nMOS transistor M3 in the switch control circuit 10 is the signal corresponding to the signal EN. In the ninth embodiment, the signal RGN that is input to the gate of the nMOS transistor M3 is set to be a signal corresponding to the signal EP. In the ninth embodiment, the description of similar points to the configuration, operation and advantageous effects of the switch circuit 1 of the second embodiment is omitted, and different points are mainly described.

9.1 Configuration of the Ninth Embodiment

FIG. 19 is a circuit diagram illustrating a configuration of a switch circuit of the ninth embodiment.

A switch circuit 1 of the ninth embodiment is different from the configuration of the second embodiment with respect to an ON/OFF switch circuit 11f included in the switch control circuit 10. Specifically, the differences are as follows.

The ON/OFF switch circuit 11f is configured such that in the configuration of the ON/OFF switch circuit 11a illustrated in FIG. 5, a wiring line connecting the output terminal of the buffer B4 and the gates of the pMOS transistor M13 and nMOS transistor M14 is omitted, the pMOS transistor M4 is omitted, the diode D2 is omitted, and a level shifter LS3 is added.

The signal EP is input to the input terminal of the level shifter LS3. The output terminal of the level shifter LS3 is connected to the gates of the pMOS transistor M13 and nMOS transistor M14. The level shifter LS3 converts the signal EP to a voltage level, the power supply of which is the power supply voltage VDD and voltage Vn.

9.2 Operation of the Ninth Embodiment

FIG. 20 is a circuit diagram illustrating a part of an operation of the ON/OFF switch circuit 11f in the switch circuit of the ninth embodiment.

In the ninth embodiment, in a case of switching the high-frequency switch 20a from the ON state to OFF state, or from the OFF state to ON state, signals EP and EN similar to those illustrated in FIG. 3 are supplied.

In the ON/OFF switch circuit 11a of the second embodiment illustrated in FIG. 5, at a time of switching the high-frequency switch 20a from the ON state to OFF state, as illustrated in part (b) of FIG. 20, there occurs leak current that flows from the power supply voltage VDD node to the node to which the source of the pMOS transistor M1 is connected, through the diode D1, nMOS transistor M3 and a parasitic diode PD1 of the pMOS transistor M1. The leak current prevents the voltage of the signal SWG from falling at the time of switching from the ON state to OFF state. Thus, the leak current becomes a cause of the delay of switching of the high-frequency switch 20a from the ON state to OFF state.

In the ON/OFF switch circuit 11f of the ninth embodiment, at a time of switching the high-frequency switch 20a from the ON state to OFF state, the switching of the signal RGN between "H" (for example, VDD) and "L" (for example, Vn) is controlled in accordance with the timing of the signal EP. In other words, the switching of the signal RGN from "H" to "L" is made to agree with the switching timing of the signal EP. Thereby, the time at which the signal RGN is switched from "H" to "L" is made earlier, and, as illustrated in part (a) of FIG. 20, the nMOS transistor M3 is turned off to stop the flow of current from the power supply voltage VDD node into the terminal TSW, and the charge at the terminal TSW is discharged to the node to which the source of the pMOS transistor M1 is connected, via the parasitic diode PD1 of the pMOS transistor M1. Thereby, an operation of preventing the voltage of the signal SWG from falling is eliminated, and the switching speed of the signal SWG from the voltage Vp to voltage Vn is increased.

In addition, the operation in the case of switching the high-frequency switch 20a from the OFF state to ON state is similar to the operation in the seventh embodiment.

9.3 Advantageous Effects of the Ninth Embodiment

According to the ninth embodiment, a semiconductor device capable of quickening ON/OFF switching of a high-frequency switch can be provided.

Furthermore, in the ninth embodiment, in the case of switching the high-frequency switch 20a from the ON state to OFF state, that is, in the case of switching the signal SWG from the voltage Vp to the voltage Vn, the switching of the signal RGN from "H" to "L" is made to agree with the switching timing of the signal EP. Thereby, the current flowing from the power supply voltage VDD node into the terminal TSW via the nMOS transistor M3 is stopped, and the switching of the signal SWG from the voltage Vp to the voltage Vn is quickened. As a result, the switching of the high-frequency switch 20a from the ON state to OFF state can be quickened.

10. Others

The semiconductor devices of the above-described embodiments may adopt the following implementation modes.

1. A semiconductor device comprising:
a first transistor (M1) configured to be supplied with a first voltage (Vp) higher than a power supply voltage (VDD) and to supply the first voltage to a first terminal (TSW);
a second transistor (M2) configured to be supplied with a second voltage (Vn) lower than a ground voltage (GND) and to supply the second voltage to the first terminal;
a third transistor (M3) configured to be supplied with the power supply voltage and to supply the power supply voltage to the first terminal;
a fourth transistor (M4) configured to be supplied with the ground voltage and to supply the ground voltage to the first terminal;
a first level shifter (LS1) configured to convert the power supply voltage to the first voltage (Vp) at a time when a first signal (EP) is the power supply voltage, and to output a second signal (RGP); and
a second level shifter (LS2) configured to convert the ground voltage to the second voltage (Vn) at a time when a third signal (EN) is the ground voltage, and to output a fourth signal (RGN), wherein
at a time of outputting the first voltage from the first terminal,
the power supply voltage is supplied to the first terminal from the third transistor in accordance with the fourth signal, and then the first voltage is supplied to the first terminal from the first transistor in accordance with the second signal, and
at a time of outputting the second voltage from the first terminal,
the ground voltage is supplied to the first terminal from the fourth transistor in accordance with the second signal, and then the second voltage is supplied to the first terminal from the second transistor in accordance with the fourth signal.

2. The semiconductor device of the above 1, further comprising a high-frequency switch (20), wherein
the high-frequency switch includes:
a second terminal (T1) and a third terminal (T2);
a plurality of first transistors connected in series between the second terminal and the third terminal; and
a plurality of first resistance elements connected in series between a gate of a fifth transistor connected to the second terminal, among the first transistors, and the first terminal, and connected between gates of the first transistors.

3. The semiconductor device of the above 2, further comprising a fourth terminal (TRN) configured to output the fourth signal, wherein
the high-frequency switch further includes:
a plurality of second transistors connected in series between the gate of the fifth transistor and the first terminal; and
a plurality of second resistance elements connected in series between a gate of a sixth transistor connected to the gate of the fifth transistor, among the second transistors, and the fourth terminal, and connected between gates of the second transistors.

4. The semiconductor device of the above 2, further comprising a fifth terminal (TRP) configured to output the second signal, wherein
the high-frequency switch further includes:
a plurality of third transistors connected in series between the gate of the fifth transistor and the first terminal; and
a plurality of third resistance elements connected in series between a gate of a seventh transistor connected to the gate of the fifth transistor, among the third transistors, and the fifth terminal, and connected between gates of the third transistors.

5. The semiconductor device of the above 1, further comprising:
a high-frequency switch including a second terminal and a third terminal; and
a fourth terminal (TRN) configured to output the fourth signal, wherein the high-frequency switch further includes:
a plurality of first transistors connected in series between the second terminal and the third terminal;
a plurality of second transistors and a plurality of first resistance elements, the second transistors and the first resistance elements being connected in parallel between gates of the first transistors and the first terminal; and
a plurality of second resistance elements connected between gates of the second transistors and the fourth terminal.

6. The semiconductor device of any one of the above 1 to 5, further comprising a power supply circuit (8) configured to generate the first voltage and the second voltage.

7. The semiconductor device of the above 6, wherein the power supply circuit includes a charge pump.

8. The semiconductor device of the above 1, further comprising:
a first diode (D1) connected between a node supplied with the power supply voltage, and the third transistor; and
a second diode (D2) connected between a node supplied with the ground voltage, and the fourth transistor.

9. The semiconductor device of the above 1, further comprising a delay circuit (12) configured to delay a control signal (CNT) and to output the first signal and the third signal.

10. A semiconductor device comprising:
a plurality of switch circuits (1); and
a delay circuit (12a) configured to delay a plurality of control signals corresponding to the switch circuits, wherein
each of the switch circuits includes:
a first transistor configured to be supplied with a first voltage higher than a power supply voltage and to supply the first voltage to a first terminal;
a second transistor configured to be supplied with a second voltage lower than a ground voltage and to supply the second voltage to the first terminal;
a third transistor configured to be supplied with the power supply voltage and to supply the power supply voltage to the first terminal;
a fourth transistor configured to be supplied with the ground voltage and to supply the ground voltage to the first terminal;
a first level shifter configured to convert the power supply voltage to the first voltage at a time when a first signal is the power supply voltage, and to output a second signal; and
a second level shifter configured to convert the ground voltage to the second voltage at a time when a third signal is the ground voltage, and to output a fourth signal, wherein
at a time of outputting the first voltage from the first terminal,
the power supply voltage is supplied to the first terminal from the third transistor in accordance with the fourth signal, and then the first voltage is supplied to the first terminal from the first transistor in accordance with the second signal,
at a time of outputting the second voltage from the first terminal,
the ground voltage is supplied to the first terminal from the fourth transistor in accordance with the second signal, and then the second voltage is supplied to the first terminal from the second transistor in accordance with the fourth signal,
the delay circuit includes a first circuit configured to generate a delay signal from the control signals, and a plurality of logical circuits configured to generate the first signal and the third signal by using each of the control signals and the delay signal,
each of the logical circuits is configured to output each of the control signals as one signal of the first signal and the third signal, and
each of the logical circuits is configured to delay each of the control signals by using the delay signal, and to output each of the delayed control signals as the other of the first signal and the third signal.

11. The semiconductor device of the above 10, wherein the first circuit includes a resistance element and a capacitance element that are paired.

12. The semiconductor device of the above 10, wherein
each of the control signals holds a voltage level of a low level or a high level, and
the first circuit includes:
a count circuit configured to count a number of transitions of the control signals from the low level to the high level, and a number of transitions of the control signals from the high level to the low level; and
a variable resistance element with a resistance value variable in accordance with the numbers of transitions counted by the count circuit.

13. The semiconductor device of the above 10, wherein
each of the control signals holds a voltage level of a low level or a high level,
the first circuit includes a plurality of flip-flops provided in association with the control signals, and a plurality of switch elements and a plurality of resistance elements, and a capacitance element, the switch elements and the resistance elements being provided in association with the flip-flops,
the resistance elements are connected in series, and one end and the other end of each of the switch elements are connected to one end and the other end of each of the resistance elements,
each of the flip-flops is configured to output a fifth signal at a time when each of the control signals transitions from the low level to the high level, or from the high level to the low level, and
each of the switch elements is set in a connected state or a disconnected state in accordance with the fifth signal.

14. The semiconductor device of any one of the above 10 to 13, further comprising a power supply circuit configured to generate the first voltage and the second voltage.

15. The semiconductor device of the above 10, further comprising a high-frequency switch (20) provided in each of the switch circuits, wherein
the high-frequency switch includes:
a second terminal (T1) and a third terminal (T2);
a plurality of first transistors connected in series between the second terminal and the third terminal; and
a plurality of first resistance elements connected in series between a gate of a fifth transistor connected to the second terminal, among the first transistors, and the first terminal, and connected between gates of the first transistors.

16. The semiconductor device of the above 15, further comprising a fourth terminal (TRN) configured to output the fourth signal, wherein
the high-frequency switch further includes:
a plurality of second transistors connected in series between the gate of the fifth transistor and the first terminal; and a plurality of second resistance elements connected in series between a gate of a sixth transistor connected to the gate of the fifth transistor, among the second transistors, and the fourth terminal, and connected between gates of the second transistors.

17. The semiconductor device of the above 15, further comprising a fifth terminal (TRP) configured to output the second signal, wherein
the high-frequency switch further includes:
a plurality of third transistors connected in series between the gate of the fifth transistor and the first terminal; and
a plurality of third resistance elements connected in series between a gate of a seventh transistor connected to the gate of the fifth transistor, among the third transistors, and the fifth terminal, and connected between gates of the third transistors.

18. The semiconductor device of the above 10, further comprising:
a high-frequency switch provided in each of the switch circuits and including a second terminal and a third terminal; and
a fourth terminal (TRN) configured to output the fourth signal, wherein
the high-frequency switch further includes:
a plurality of first transistors connected in series between the second terminal and the third terminal;
a plurality of second transistors and a plurality of first resistance elements, the second transistors and the first resistance elements being connected in parallel between gates of the first transistors and the first terminal; and
a plurality of second resistance elements connected between gates of the second transistors and the fourth terminal.

The semiconductor devices of the above-described embodiments are applicable to an antenna tuning switch of a mobile terminal such as a mobile phone or a smartphone, a switch for a base station, a phase shift switch, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first transistor configured to be supplied with a first voltage higher than a power supply voltage and to supply the first voltage to a first terminal;
a second transistor configured to be supplied with a second voltage lower than a ground voltage and to supply the second voltage to the first terminal;
a third transistor configured to be supplied with the power supply voltage and to supply the power supply voltage to the first terminal;
a fourth transistor configured to be supplied with the ground voltage and to supply the ground voltage to the first terminal;
a first level shifter configured to convert the power supply voltage to the first voltage at a time when a first signal is the power supply voltage, and to output a second signal; and
a second level shifter configured to convert the ground voltage to the second voltage at a time when a third signal is the ground voltage, and to output a fourth signal, wherein
at a time of outputting the first voltage from the first terminal,
the power supply voltage is supplied to the first terminal from the third transistor in accordance with the fourth signal, and then the first voltage is supplied to the first terminal from the first transistor in accordance with the second signal, and
at a time of outputting the second voltage from the first terminal,
the ground voltage is supplied to the first terminal from the fourth transistor in accordance with the second signal, and then the second voltage is supplied to the first terminal from the second transistor in accordance with the fourth signal.

2. The semiconductor device according to claim 1, further comprising a high-frequency switch, wherein
the high-frequency switch includes:
a second terminal and a third terminal;
a plurality of first transistors connected in series between the second terminal and the third terminal; and
a plurality of first resistance elements connected in series between a gate of a fifth transistor connected to the second terminal, among the first transistors, and the first terminal, and connected between gates of the first transistors.

3. The semiconductor device according to claim 2, further comprising a fourth terminal configured to output the fourth signal, wherein
the high-frequency switch further includes:
a plurality of second transistors connected in series between the gate of the fifth transistor and the first terminal; and
a plurality of second resistance elements connected in series between a gate of a sixth transistor connected to the gate of the fifth transistor, among the second transistors, and the fourth terminal, and connected between gates of the second transistors.

4. The semiconductor device according to claim 2, further comprising a fifth terminal configured to output the second signal, wherein
the high-frequency switch further includes:
a plurality of third transistors connected in series between the gate of the fifth transistor and the first terminal; and
a plurality of third resistance elements connected in series between a gate of a seventh transistor connected to the gate of the fifth transistor, among the third transistors, and the fifth terminal, and connected between gates of the third transistors.

5. The semiconductor device according to claim 1, further comprising:
a high-frequency switch including a second terminal and a third terminal; and
a fourth terminal configured to output the fourth signal, wherein
the high-frequency switch further includes:
a plurality of first transistors connected in series between the second terminal and the third terminal;
a plurality of second transistors and a plurality of first resistance elements, the second transistors and the first resistance elements being connected in parallel between gates of the first transistors and the first terminal; and a plurality of second resistance elements connected between gates of the second transistors and the fourth terminal.

6. The semiconductor device according to claim 1, further comprising a power supply circuit configured to generate the first voltage and the second voltage.

7. The semiconductor device according to claim 6, wherein the power supply circuit includes a charge pump.

8. The semiconductor device according to claim 1, further comprising:
a first diode connected between a node supplied with the power supply voltage, and the third transistor; and
a second diode connected between a node supplied with the ground voltage, and the fourth transistor.

9. The semiconductor device according to claim 1, further comprising a delay circuit configured to delay a control signal and to output the first signal and the third signal.

10. A semiconductor device comprising:
a plurality of switch circuits; and
a delay circuit configured to delay a plurality of control signals corresponding to the switch circuits, wherein
each of the switch circuits includes:
a first transistor configured to be supplied with a first voltage higher than a power supply voltage and to supply the first voltage to a first terminal;
a second transistor configured to be supplied with a second voltage lower than a ground voltage and to supply the second voltage to the first terminal;
a third transistor configured to be supplied with the power supply voltage and to supply the power supply voltage to the first terminal;
a fourth transistor configured to be supplied with the ground voltage and to supply the ground voltage to the first terminal;
a first level shifter configured to convert the power supply voltage to the first voltage at a time when a first signal is the power supply voltage, and to output a second signal; and
a second level shifter configured to convert the ground voltage to the second voltage at a time when a third signal is the ground voltage, and to output a fourth signal, wherein
at a time of outputting the first voltage from the first terminal,
the power supply voltage is supplied to the first terminal from the third transistor in accordance with the fourth signal, and then the first voltage is supplied to the first terminal from the first transistor in accordance with the second signal,
at a time of outputting the second voltage from the first terminal,
the ground voltage is supplied to the first terminal from the fourth transistor in accordance with the second signal, and then the second voltage is supplied to the first terminal from the second transistor in accordance with the fourth signal,
the delay circuit includes a first circuit configured to generate a delay signal from the control signals, and a plurality of logical circuits configured to generate the first signal and the third signal by using each of the control signals and the delay signal,
each of the logical circuits is configured to output each of the control signals as one signal of the first signal and the third signal, and
each of the logical circuits is configured to delay each of the control signals by using the delay signal, and to output each of the delayed control signals as the other of the first signal and the third signal.

11. The semiconductor device according to claim 10, wherein the first circuit includes a resistance element and a capacitance element that are paired.

12. The semiconductor device according to claim 10, wherein
each of the control signals holds a voltage level of a low level or a high level, and
the first circuit includes:
a count circuit configured to count a number of transitions of the control signals from the low level to the high level, and a number of transitions of the control signals from the high level to the low level; and
a variable resistance element with a resistance value variable in accordance with the numbers of transitions counted by the count circuit.

13. The semiconductor device according to claim 10, wherein
each of the control signals holds a voltage level of a low level or a high level,
the first circuit includes a plurality of flip-flops provided in association with the control signals, and a plurality of switch elements and a plurality of resistance elements, and a capacitance element, the switch elements and the resistance elements being provided in association with the flip-flops,
the resistance elements are connected in series, and one end and the other end of each of the switch elements are connected to one end and the other end of each of the resistance elements,
each of the flip-flops is configured to output a fifth signal at a time when each of the control signals transitions from the low level to the high level, or from the high level to the low level, and
each of the switch elements is set in a connected state or a disconnected state in accordance with the fifth signal.

14. The semiconductor device according to claim 10, further comprising a power supply circuit configured to generate the first voltage and the second voltage.

15. The semiconductor device according to claim 10, further comprising a high-frequency switch provided in each of the switch circuits, wherein
the high-frequency switch includes:
a second terminal and a third terminal;
a plurality of first transistors connected in series between the second terminal and the third terminal; and
a plurality of first resistance elements connected in series between a gate of a fifth transistor connected to the second terminal, among the first transistors, and the first terminal, and connected between gates of the first transistors.

16. The semiconductor device according to claim 15, further comprising a fourth terminal configured to output the fourth signal, wherein
the high-frequency switch further includes:
a plurality of second transistors connected in series between the gate of the fifth transistor and the first terminal; and
a plurality of second resistance elements connected in series between a gate of a sixth transistor connected to the gate of the fifth transistor, among the second transistors, and the fourth terminal, and connected between gates of the second transistors.

17. The semiconductor device according to claim 15, further comprising a fifth terminal configured to output the second signal, wherein the high-frequency switch further includes:
a plurality of third transistors connected in series between the gate of the fifth transistor and the first terminal; and
a plurality of third resistance elements connected in series between a gate of a seventh transistor connected to the gate of the fifth transistor, among the third transistors, and the fifth terminal, and connected between gates of the third transistors.

18. The semiconductor device according to claim 10, further comprising:
a high-frequency switch provided in each of the switch circuits and including a second terminal and a third terminal; and
a fourth terminal configured to output the fourth signal, wherein
the high-frequency switch further includes:
a plurality of first transistors connected in series between the second terminal and the third terminal;
a plurality of second transistors and a plurality of first resistance elements, the second transistors and the first resistance elements being connected in parallel between gates of the first transistors and the first terminal; and
a plurality of second resistance elements connected between gates of the second transistors and the fourth terminal.

\* \* \* \* \*